US012796164B2

(12) United States Patent
Nomura et al.

(10) Patent No.: US 12,796,164 B2
(45) Date of Patent: Nov. 10, 2026

(54) METHOD OF MANUFACTURING WAFER

(71) Applicant: DISCO CORPORATION, Tokyo (JP)

(72) Inventors: Teppei Nomura, Tokyo (JP); Zhiwen Chen, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 859 days.

(21) Appl. No.: 18/152,865

(22) Filed: Jan. 11, 2023

(65) Prior Publication Data

US 2023/0261134 A1 Aug. 17, 2023

(30) Foreign Application Priority Data

Jan. 27, 2022 (JP) ................................ 2022-011228

(51) Int. Cl.
*H10P 74/20* (2026.01)
*H10H 20/01* (2025.01)
*H10P 74/00* (2026.01)

(52) U.S. Cl.
CPC ........... *H10H 20/01* (2025.01); *H10P 74/207* (2026.01); *H10P 74/232* (2026.01)

(58) Field of Classification Search
CPC ..................................................... H10P 74/232
See application file for complete search history.

(56) References Cited

U.S. PATENT DOCUMENTS

2013/0084658 A1* 4/2013 Vaupel .................... H10P 54/00 438/107
2015/0001718 A1* 1/2015 Hatada .................. H01L 23/552 257/741
2020/0367395 A1 11/2020 Liao
2021/0193894 A1* 6/2021 You ...................... H10H 20/857

FOREIGN PATENT DOCUMENTS

JP S63114221 A 5/1988
JP 06338545 A 12/1994
JP 2003249620 A 9/2003
JP 2015012005 A * 1/2015 ....... H01L 23/49838
JP 2018107421 A 7/2018
JP 2018194718 A 12/2018
(Continued)

OTHER PUBLICATIONS

Office Action issued in counterpart Japanese patent application No. 2022-011228, dated Oct. 14, 2025.
(Continued)

*Primary Examiner* — Molly K Reida
(74) *Attorney, Agent, or Firm* — Greer, Burns & Crain, Ltd

(57) ABSTRACT

A method of manufacturing a wafer includes a wafer preparing step of preparing a wafer including a plurality of semiconductor devices joined to a substrate by respective adhesive layers, a determining step of determining whether each of the semiconductor devices joined to the substrate is defective or non-defective, a laser beam applying step of applying a laser beam to heat one of the adhesive layers by which one of the semiconductor devices that has been determined as defective is bonded to the substrate, thereby melting the adhesive layer in an area of the wafer that is irradiated with the laser beam, and a treating step of treating the semiconductor device released from a bonded state due to the adhesive layer being melted in the laser beam applying step.

7 Claims, 17 Drawing Sheets

(56) References Cited

FOREIGN PATENT DOCUMENTS

| | | | | | |
|---|---|---|---|---|---|
| JP | 2021018386 A | | 2/2021 | | |
| KR | 20190085273 A | * | 7/2019 | ........... | H01L 21/485 |
| KR | 20200109656 A | | 9/2020 | | |
| KR | 102212841 B1 | | 2/2021 | | |

OTHER PUBLICATIONS

Japanese Patent Application No. 2022-011228: English translation of Office Action, Feb. 10, 2026 (3 pages).
Korean Patent Application No. 20230006408: English translation of Office Action, Jul. 3, 2026 (12 pages).

* cited by examiner

METHOD OF MANUFACTURING WAFER

BACKGROUND OF THE INVENTION

Field of the Invention

The present invention relates to a method of manufacturing a wafer.

Description of the Related Art

Optical devices such as light-emitting diodes (LEDs) are produced by the epitaxial growth of an n-type semiconductor layer and a p-type semiconductor layer that make up a pn junction on the surface of a sapphire substrate, for example. In recent years, there has been developed a technology for manufacturing minute LEDs called micro LEDs by dividing a semiconductor layer into a number of LEDs by way of etching (see, for example, Japanese Patent Laid-open No. 2018-107421).

There is also known a technology, referred to as laser lift-off, for transferring an optical device layer from a sapphire substrate to a different transfer substrate. According to laser lift-off, an optical device layer peeled off from a sapphire substrate is transferred to a transfer substrate via an adhesive layer (see, for example, Japanese Patent Laid-open No. 2018-194718).

However, if devices in an optical device layer are damaged in an intervening process such as etching or lift-off, those defective devices tend to lower the yield of optical devices.

The above problem occurs not only in the fabrication of micro LEDs, but also in a step of manufacturing stacked device chips. According to a step of manufacturing stacked device chips, a plurality of wafers are stacked together, and semiconductor devices of the wafers are electrically connected to each other by electrodes extending through the stacked wafers, producing a stacked wafer assembly. The process is also referred to as a wafer-on-wafer (WOW) process (see, for example, Japanese Patent Laid-open No. 2003-249620).

SUMMARY OF THE INVENTION

The manufacturing process disclosed in Japanese Patent Laid-open No. 2003-249620 is problematic in that, if defective devices are included in stacked wafers, stacked devices including those defective devices are produced, and hence the yield of stacked devices is lowered.

In addition, the manufacturing process disclosed in Japanese Patent Laid-open No. 2003-249620 is further disadvantageous in that, if some of the stacked wafers suffer junction failures, stacked devices where the devices have junction failures are fabricated, also resulting in a reduction in the yield of stacked devices.

As described above, wafers where semiconductor devices are stacked on substrates have heretofore been liable to cause a reduction in the yield of stacked devices providing defective semiconductor devices are stacked or semiconductor devices suffer junction failures.

It is therefore an object of the present invention to provide a method of manufacturing a wafer in a manner to avoid a reduction in the yield of semiconductor devices to be fabricated from the wafer.

In accordance with an aspect of the present invention, there is provided a method of manufacturing a wafer, including a wafer preparing step of preparing a wafer including a plurality of semiconductor devices joined to a substrate by respective adhesive layers, a determining step of determining whether each of the semiconductor devices joined to the substrate is defective or non-defective, a laser beam applying step of applying a laser beam to heat one of the adhesive layers by which one of the semiconductor devices that has been determined as defective is bonded to the substrate, thereby melting the adhesive layer in an area of the wafer that is irradiated with the laser beam, and a treating step of treating the semiconductor device released from a bonded state due to the adhesive layer being melted in the laser beam applying step.

Preferably, the laser beam is applied to the adhesive layer through the semiconductor device. Preferably, the treating step is a rejoining step of rejoining the semiconductor device to the substrate.

Preferably, the treating step is a removing step of removing the semiconductor device from the substrate. Preferably, the removing step includes a step of allowing the semiconductor device of the wafer to drop freely downwardly. Preferably, the removing step includes a step of ejecting a gas toward the semiconductor device that has dropped freely downwardly, to retrieve the semiconductor device.

Preferably, the removing step includes a step of ejecting a gas toward the semiconductor device released from the bonded state, to lift the semiconductor device off the substrate, and a step of attracting the lifted semiconductor device under suction to remove the semiconductor device from the substrate.

Preferably, the method of manufacturing a wafer further includes a non-defective semiconductor device bonding step, after the removing step, of bonding a semiconductor device having the same functions as those of the semiconductor device determined as defective to an area from which the semiconductor device determined as defective has been removed.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described below. Further, the arrangements described below can be combined in appropriate manners. Various omissions, replacements, or changes of the arrangements may be made without departing from the scope of the present invention. In the description below, those components that are identical to each other are denoted by identical reference signs.

First Embodiment

Figure 1:
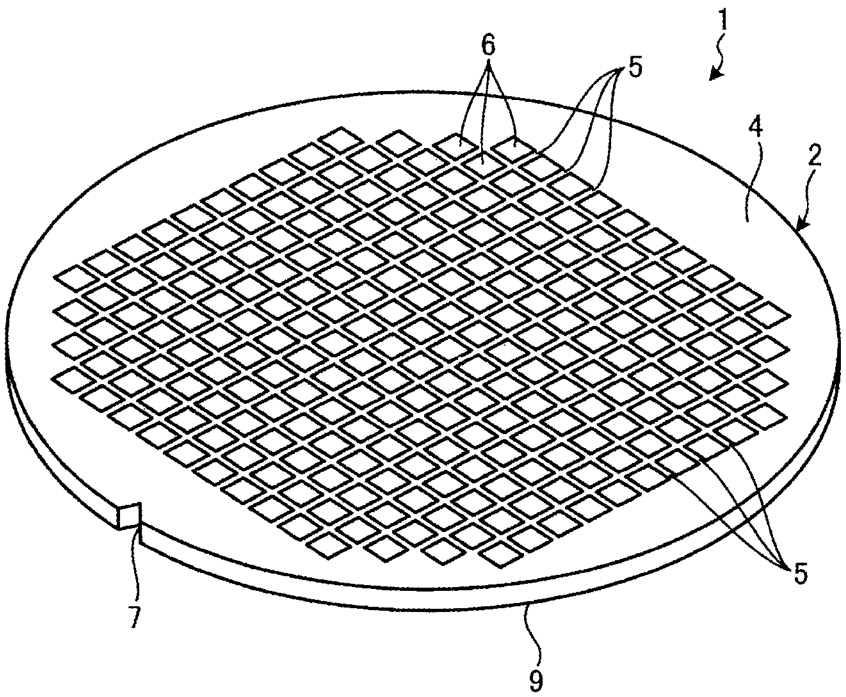
FIG. 1 is a perspective view schematically illustrating a wafer to be processed by a method of manufacturing a wafer according to a first embodiment of the present invention.
Figure 2:
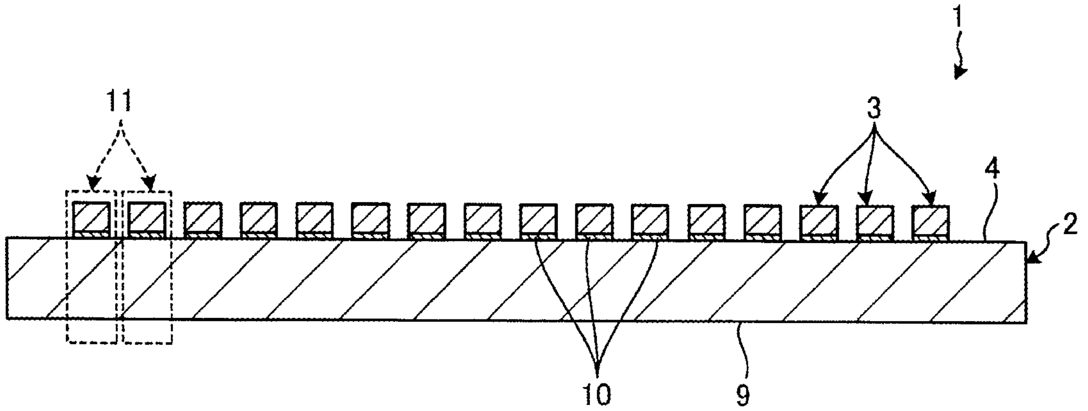
FIG. 2 is a schematic cross-sectional view of the wafer illustrated in FIG. 1.
Figure 3:
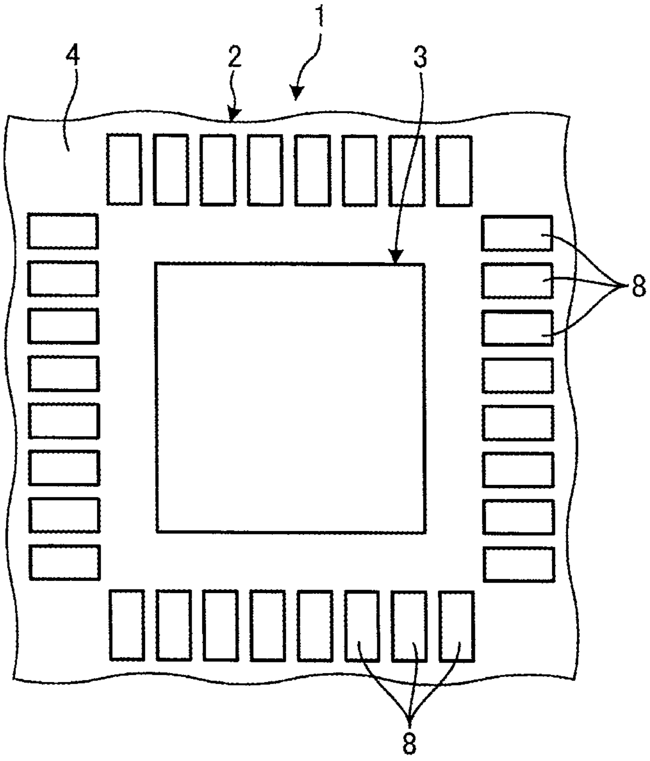
FIG. 3 is an enlarged fragmentary plan view of a substrate wafer, a semiconductor device, and a plurality of electrodes of the wafer illustrated in FIG. 2.
Figure 4:
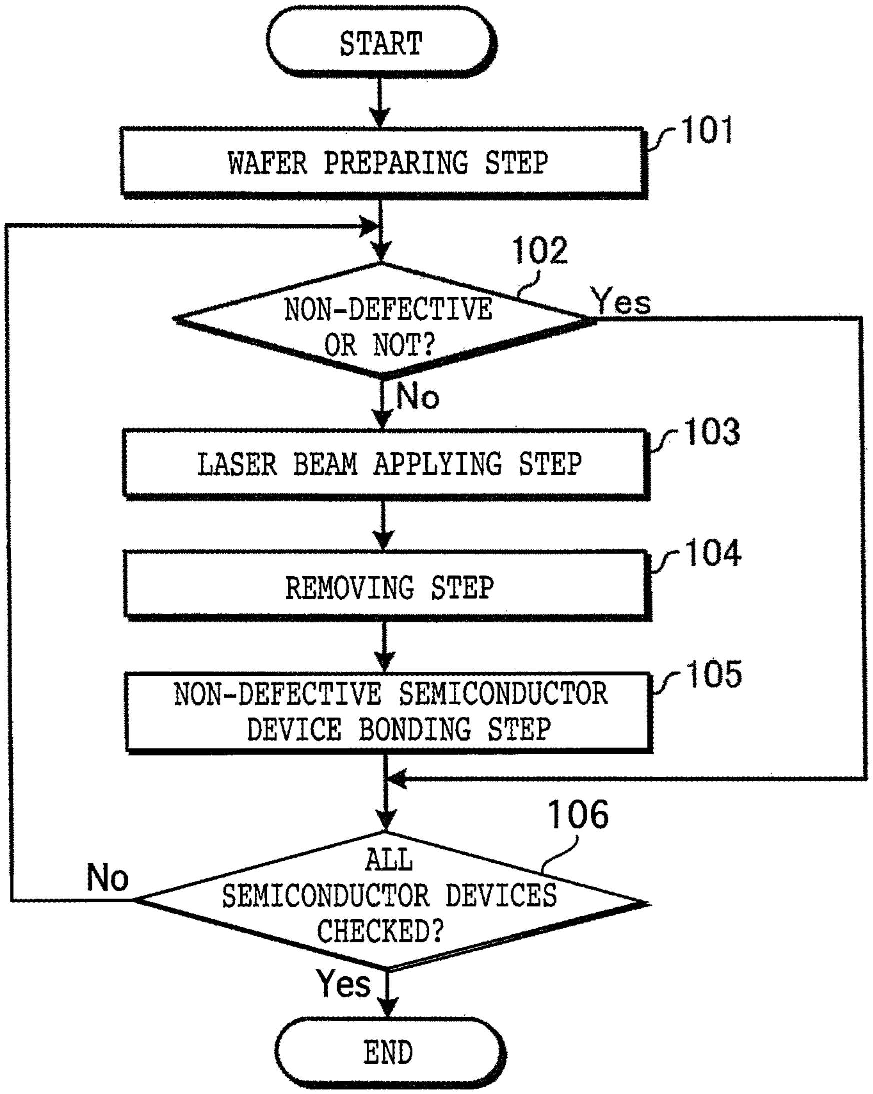
FIG. 4 is a flowchart of a sequence of the method of manufacturing a wafer according to the first embodiment.

A method of manufacturing a wafer according to a first embodiment of the present invention will be described below with reference to the drawings. FIG. 1 schematically illustrates, in perspective, a wafer to be processed by the method of manufacturing a wafer according to the first embodiment. FIG. 2 schematically illustrates, in cross section, the wafer illustrated in FIG. 1. FIG. 3 schematically illustrates, in enlarged fragmentary plan, a substrate wafer, a semiconductor device, and a plurality of electrodes of the wafer illustrated in FIG. 2. FIG. 4 is a flowchart of a sequence of the method of manufacturing a wafer according to the first embodiment.

(Wafer)

The method of manufacturing a wafer according to the first embodiment, hereinafter also referred to as the manufacturing method according to the first embodiment, is a method of manufacturing the wafer, denoted by 1, illustrated in FIGS. 2 and 3. The wafer 1 to be processed by the manufacturing method according to the first embodiment includes a substrate wafer 2, which corresponds to a substrate, and a plurality of semiconductor devices 3 joined to the substrate wafer 2. The substrate wafer 2 includes a circular semiconductor wafer or the like that is made of a base material such as silicon, gallium arsenide, or silicon carbide (Sic). The substrate wafer 2 has a plurality of intersecting projected dicing lines 5 established on a face side 4 thereof that demarcate a grid of areas on the face side 4 with respective devices 6 provided in those areas.

The devices 6 include, for example, integrated circuits (ICs), large-scale-integration (LSI) circuits, or the like, or memories, i.e., semiconductor storage devices, or the like. The substrate wafer 2 has an irregularly shaped notch 7 defined in an outer edge thereof as an indicator of the crystal orientation of the substrate wafer 2.

The semiconductor devices 3 are joined or bonded to the respective devices 6 on the substrate wafer 2 by respective adhesive layers 10. In FIG. 1, the semiconductor devices 3 are omitted from illustration. The semiconductor devices 3 are chips including ICs, LSI circuits, or the like, or memories, i.e., semiconductor storage devices, or the like.

Therefore, the wafer 1 includes the semiconductor devices 3 that are joined to the respective devices 6 on the substrate wafer 2 by the adhesive layers 10. According to the first embodiment, the adhesive layers 10 electrically interconnect electrodes of the devices 6 on the substrate wafer 2 and electrodes of the semiconductor devices 3. According to the present invention, however, the substrate wafer and the semiconductor devices may be fixed to each other by a resin layer.

The semiconductor devices 3 are fabricated as follows. A second substrate wafer that is structurally similar to the substrate wafer 2 has devices disposed on a face side thereof and separated from each other by grooves therebetween is stacked on the substrate wafer 2 with the adhesive layers 10. Thereafter, the second substrate wafer is thinned down by being ground and polished until the grooves are exposed on a reverse side thereof, so that the second substrate wafer is divided into pieces having the respective devices as the semiconductor devices 3. The semiconductor devices 3 into which the second substrate wafer has been divided are now joined to the respective devices 6 on the substrate wafer 2 by the adhesive layers 10.

The semiconductor devices 3 that are joined to the substrate wafer 2 may include non-defective devices and defective devices where device circuits etc. are defective. The semiconductor devices 3 are checked for their quality by applying a probe against electrodes of the devices on the second substrate wafer prior to being joined to the substrate wafer 2, measuring electric characteristics of the devices through the probe, and determining whether or not the measured electric characteristics satisfy predetermined standards. In the wafer 1 that includes the semiconductor devices 3, the positions of the non-defective semiconductor devices 3 and the positions of the defective semiconductor devices 3 have been recognized in advance on the basis of the measured electric characteristics of the devices of the second substrate wafer. The positions of the semiconductor devices 3 are determined with respect to the notch 7 or the like.

According to the first embodiment, as illustrated in FIG. 3, the wafer 1 also includes a plurality of electrodes 8 disposed around each of the semiconductor devices 3 joined to the substrate wafer 2 by the adhesive layers 10. The electrodes 8 are made of an electrically conductive metal material and disposed on the substrate provided as the substrate wafer 2. The electrodes 8 are electrically connected to each other in a predetermined pattern and also to an area where the semiconductor device 3 surrounded by the electrodes 8 is disposed. According to the first embodiment, the wafer 1 includes the electrodes 8 disposed around each of the semiconductor devices 3. According to the present invention, however, the wafer 1 may be free of the electrodes 8. The wafer 1 is divided along the projected dicing lines 5 into individual stacked device chips 11 (see FIG. 2). Each of the stacked device chips 11 includes a portion of the base material of the substrate wafer 2, one of the devices 6, one of the adhesive layers 10, and one of the semiconductor devices 3.

(Method of Manufacturing a Wafer)

As illustrated in FIG. 4, the method of manufacturing a wafer according to the first embodiment includes a wafer preparing step 101, a defective/non-defective device determining step 102 of determining whether or not a semiconductor device is defective, a laser beam applying step 103, a removing step 104 as a treating step, and a non-defective semiconductor device bonding step 105.

(Wafer Preparing Step)

Figure 5:
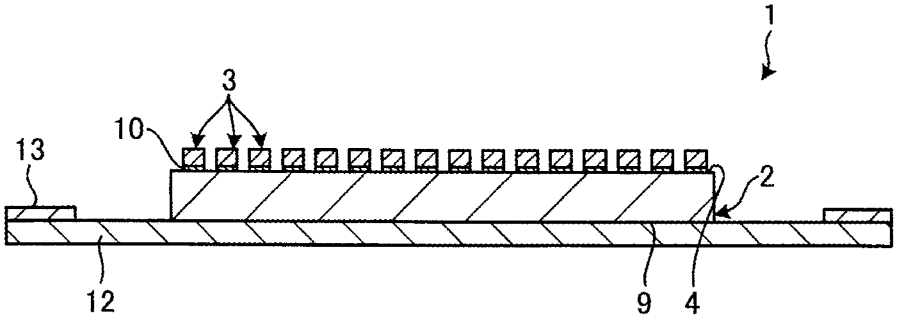
FIG. 5 is a schematic cross-sectional view of a wafer prepared in a wafer preparing step of the method of manufacturing a wafer illustrated in FIG. 4.

FIG. 5 schematically illustrates, in cross section, a wafer prepared in the wafer preparing step 101 of the method of manufacturing a wafer illustrated in FIG. 4. The wafer preparing step 101 refers to a step of preparing the wafer 1 having the structure described above.

According to the first embodiment, as illustrated in FIG. 5, a circular tape 12 that is larger in diameter than the wafer 1 is affixed to a reverse side 9 of the wafer 1 that is opposite the face side 4 thereof, and an annular frame 13 is affixed to an outer edge portion of the tape 12, thereby preparing an assembly including the wafer 1.

(Step of Determining Whether or not a Semiconductor Device is Defective)

The defective/non-defective device determining step 102 refers to a step of determining whether or not each of the semiconductor devices 3 joined to the substrate wafer 2 is defective. According to the first embodiment, the defective/non-defective device determining step 102 determines whether or not a semiconductor device 3 itself is defective, i.e., defective or non-defective, as the state of the semiconductor device 3.

According to the first embodiment, the defective/non-defective device determining step 102 determines whether or not the semiconductor devices 3 joined to the substrate wafer 2 are defective, one by one according to a predetermined sequence. According to the first embodiment, specifically, the defective/non-defective device determining step 102 determines whether or not a semiconductor device 3 as a target to be determined is defective, on the basis of the positions of the non-defective semiconductor devices 3 and the positions of the defective semiconductor devices 3 that have been recognized in advance. If it is determined in the defective/non-defective device determining step 102 that a semiconductor device 3 as a target to be determined is defective (determining step 102: No), the sequence goes to the laser beam applying step 103.

(Laser Beam Applying Step)

Figure 6:
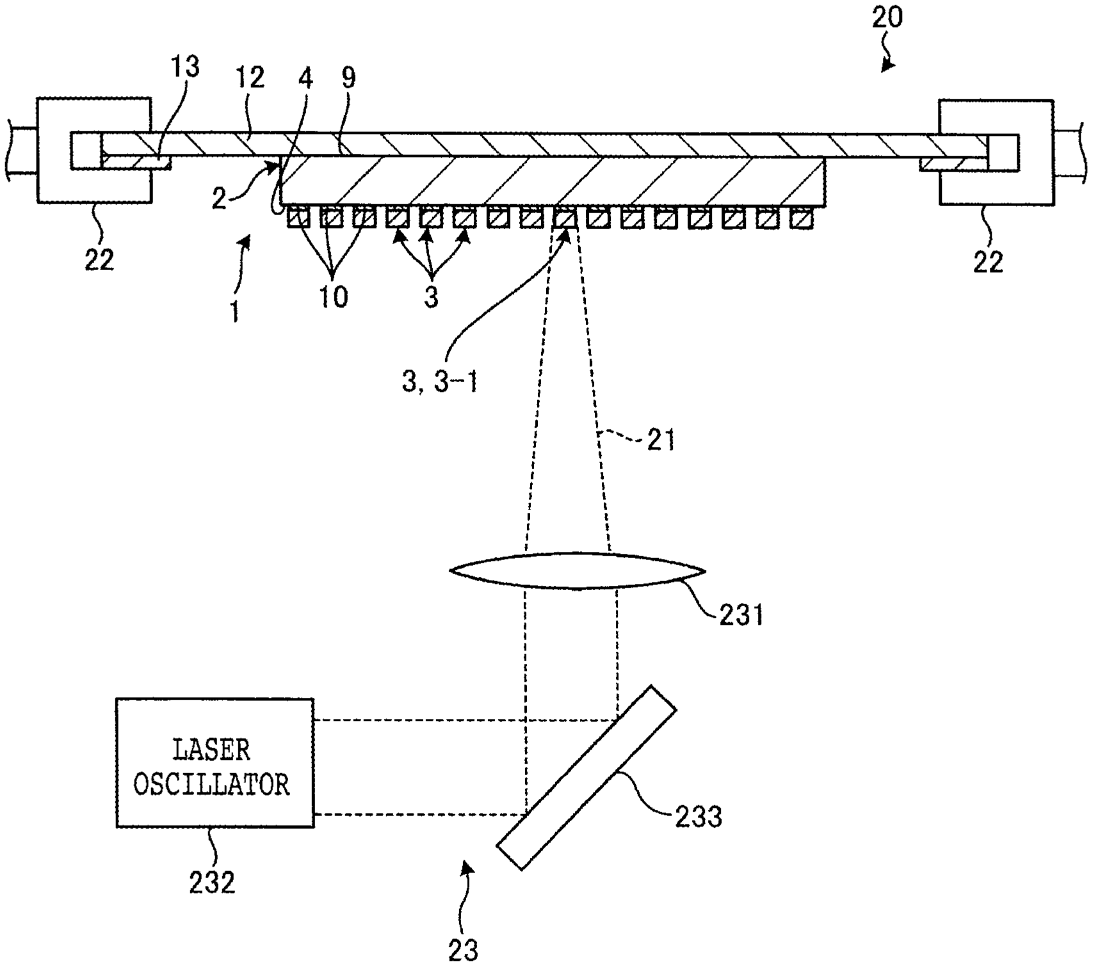
FIG. 6 is a side elevational view, partly in cross section, schematically illustrating a laser beam applying step of the method of manufacturing a wafer illustrated in FIG. 4.

FIG. 6 schematically illustrates, in side elevation, partly in cross section, the laser beam applying step 103 of the method of manufacturing a wafer illustrated in FIG. 4. The laser beam applying step 103 refers to a step of applying, from a laser processing apparatus 20 illustrated in FIG. 6, a laser beam 21 to the wafer 1 to heat the adhesive layer 10 to which the semiconductor device 3, hereinafter denoted by 3-1, that has been determined as defective in the defective/non-defective device determining step 102 (defective in the first embodiment) is bonded, thereby melting the adhesive layer 10 in the area irradiated with the laser beam 21.

According to the first embodiment, in the laser beam applying step 103, the laser processing apparatus 20 grips the outer edge portions of the annular frame 13 and the tape 12 with grippers 22 such that the face side 4 of the wafer 1 faces downwardly, as illustrated in FIG. 6. According to the first embodiment, in the laser beam applying step 103, the laser processing apparatus 20 orients a focusing lens 231 of a laser beam applying unit 23 that is positioned below the wafer 1 with the annular frame 13 gripped by the grippers 22, in facing relation to the semiconductor device 3-1 that has been determined as defective in the defective/non-defective device determining step 102 along an optical axis of the laser beam 21 applied by the laser beam applying unit 23.

In the laser beam applying step 103, the laser processing apparatus 20 emits the laser beam 21 that has a wavelength absorbable by the substrate wafer 2 and the semiconductor devices 3 from a laser oscillator 232 of the laser beam applying unit 23. The laser beam 21 emitted from the laser oscillator 232 is reflected by a mirror 233 toward the focusing lens 231, which focuses the laser beam 21 onto the semiconductor device 3-1 that has been determined as defective in the defective/non-defective device determining step 102. The focused laser beam 21 is continuously applied to the semiconductor device 3-1 for a predetermined period of time.

According to the first embodiment, in the laser beam applying step 103, the laser processing apparatus 20 focuses the laser beam 21 with the focusing lens 231 onto the entire surface of the semiconductor device 3-1 that has been determined as defective in the defective/non-defective device determining step 102. According to the first embodiment, the area to be irradiated with the laser beam 21 is the entire surface of the semiconductor device 3-1 that has been determined as defective in the defective/non-defective device determining step 102. When irradiated with the laser beam 21, the semiconductor device 3-1 that has been determined as defective in the defective/non-defective device determining step 102 is heated, melting the adhesive layer 10 by which the semiconductor device 3-1 determined as defective in the defective/non-defective device determining step 102 has been fixed to the corresponding device 6.

In this manner, the laser beam 21 is applied to the semiconductor device 3-1 to heat the semiconductor device 3-1, thereby heating and melting the adhesive layer 10. The fact that the laser beam 21 is applied to the semiconductor device 3-1 to heat the semiconductor device 3-1, thereby heating and melting the adhesive layer 10 is equivalent to a condition in which the laser beam 21 is applied through the semiconductor device 3-1 to the adhesive layer 10.

According to the first embodiment, the intensity of the laser beam 21 applied in the laser beam applying step 103, also referred to as a laser power density, and the period of time during which the laser beam 21 is applied to the semiconductor device 3-1 should desirably be of details chosen to melt the adhesive layer 10 without causing damage to the semiconductor device 3-1 and the device 6.

(Removing Step)

Figure 7:
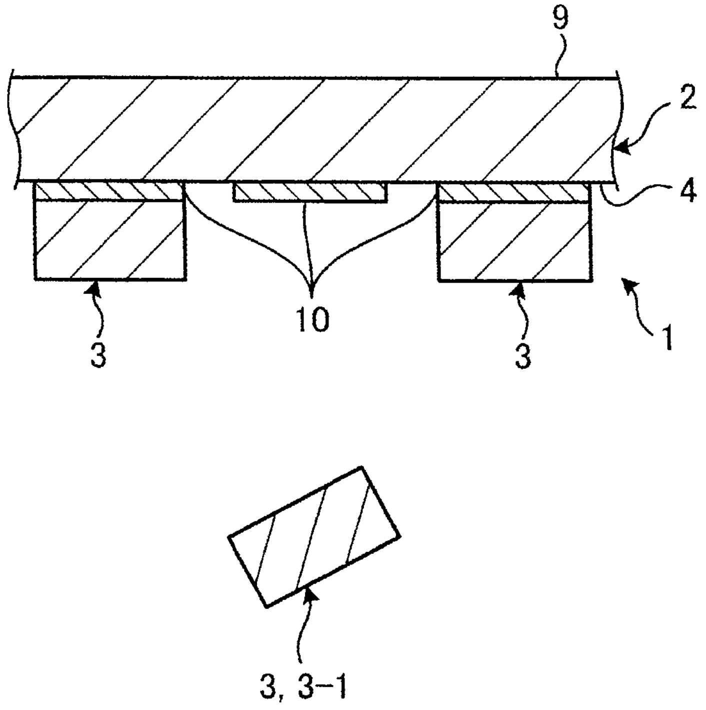
FIG. 7 is an enlarged fragmentary cross-sectional view schematically illustrating a removing step of the method of manufacturing a wafer illustrated in FIG. 4.

FIG. 7 schematically illustrates, in enlarged fragmentary cross section, the removing step 104 of the method of manufacturing a wafer illustrated in FIG. 4. The removing step 104 refers to a step of removing the semiconductor device 3-1 from the device 6 on the substrate wafer 2. The removing step 104 is also a step of treating the semiconductor device 3-1 so as to be released from the joined or bonded state due to the adhesive layer 10 being melted in the laser beam applying step 103. According to the first embodiment, therefore, the term "treating" as used above represents removing the semiconductor device 3-1.

According to the first embodiment, in the removing step 104, the bonding strength of the adhesive layer 10 that has been melted in the laser beam applying step 103 is lowered, allowing the semiconductor device 3-1 to drop freely downwardly from the wafer 1 under its own weight. In the removing step 104, therefore, the semiconductor device 3-1 drops freely downwardly from the wafer 1. According to the first embodiment, the phrase "released from the bonded state" represents a condition in which the bonding strength of the adhesive layer 10 becomes smaller than the force with which the semiconductor device 3-1 drops freely under its own weight.

(Non-Defective Semiconductor Device Bonding Step)

Figure 8:
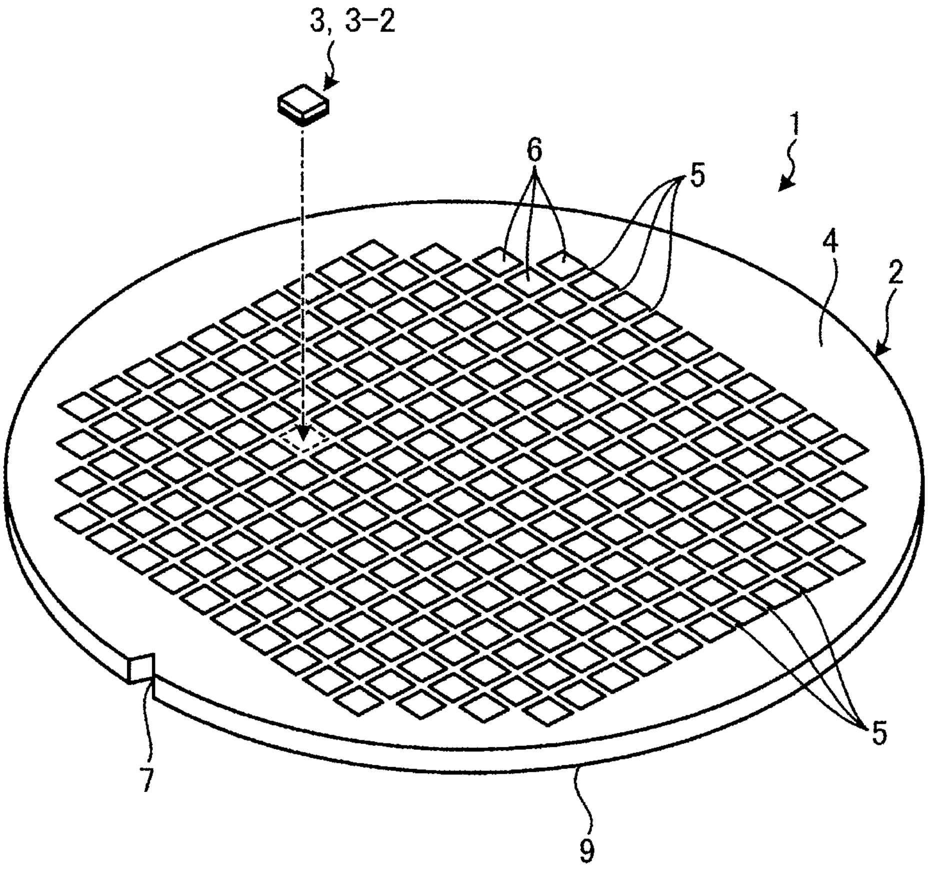
FIG. 8 is a perspective view schematically illustrating a non-defective semiconductor device bonding step of the method of manufacturing a wafer illustrated in FIG. 4.
Figure 9:
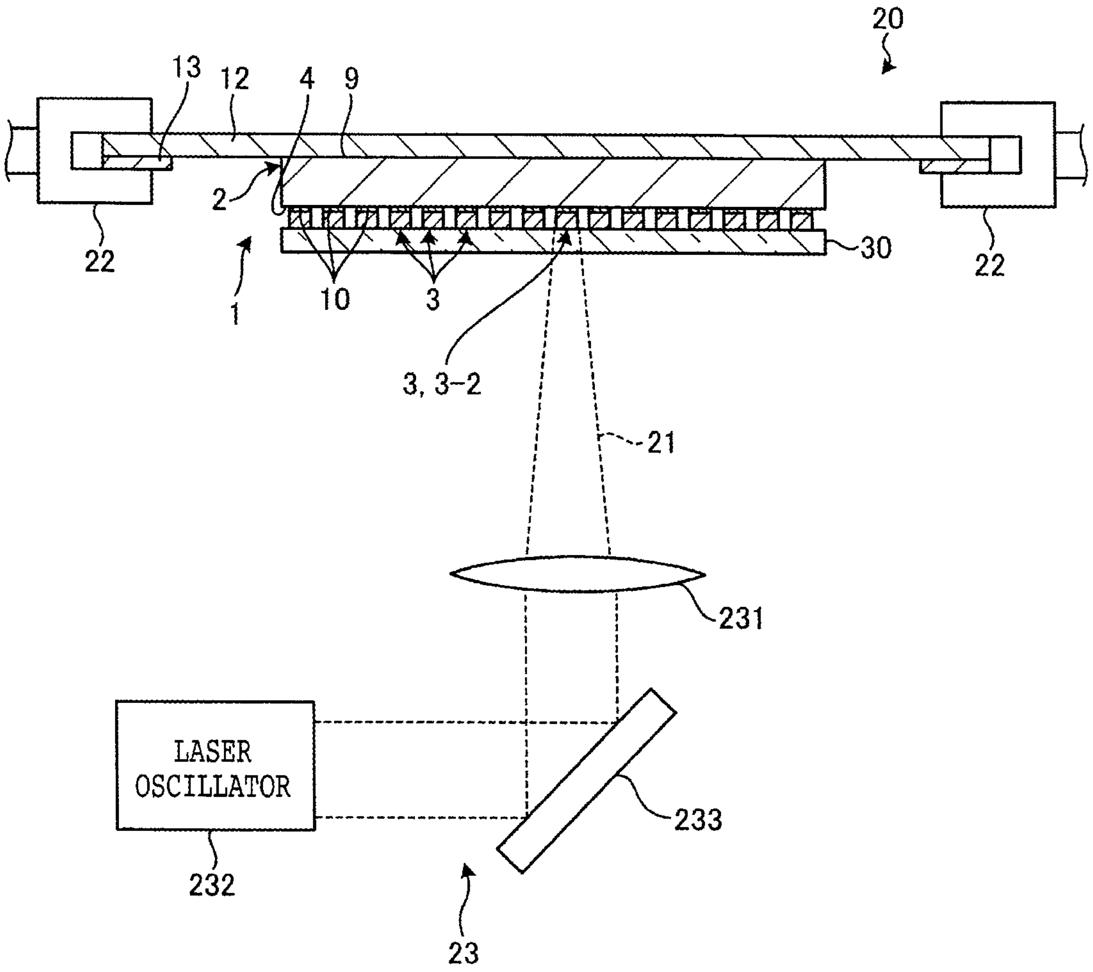
FIG. 9 is a side elevational view, partly in cross section, schematically illustrating the non-defective semiconductor device bonding step of the method of manufacturing a wafer illustrated in FIG. 4.

FIG. 8 schematically illustrates, in perspective, the non-defective semiconductor device bonding step 105 of the method of manufacturing a wafer illustrated in FIG. 4. FIG. 9 schematically illustrates, in side elevation, partly in cross section, the non-defective semiconductor device bonding step 105 of the method of manufacturing a wafer illustrated in FIG. 4.

The non-defective semiconductor device bonding step 105 refers to a step, after the removing step 104, of bonding a non-defective semiconductor device 3, hereinafter denoted by 3-2, that has the same functions those of as the semiconductor device 3-1 to the area of the wafer 1 from which the semiconductor device 3-1 determined as defective in the defective/non-defective device determining step 102 has been removed. In the non-defective semiconductor device bonding step 105, the non-defective semiconductor device 3-2 illustrated in FIG. 8 is placed on the adhesive layer 10 in the area of the wafer 1 from which the semiconductor device 3-1 has been removed in the removing step 104, and, as illustrated in FIG. 9, while the non-defective semiconductor device 3-2 is being pressed toward the substrate wafer 2 by a presser 30 shaped as a flat plate, the laser processing apparatus 20 applies the laser beam 21 through the presser 30 to the semiconductor device 3-2 for a predetermined period of time. The presser 30 is made of a material transmissive of the laser beam 21, e.g., quartz glass or the like.

When irradiated with the laser beam 21, the semiconductor device 3-2 is heated to melt the adhesive layer 10 from which the semiconductor device 3-1 has been removed in the removing step 104. In the non-defective semiconductor device bonding step 105, since the semiconductor device 3-2 is being pressed toward the substrate wafer 2 by the presser 30, the adhesive layer 10 is held in intimate contact with the semiconductor device 3-2. Then, the laser processing apparatus 20 stops applying the laser beam 21. The temperature of the adhesive layer 10 is lowered, allowing the adhesive layer 10 to solidify to thereby join the semiconductor device 3-2 to the corresponding device 6 on the substrate wafer 2.

According to the first embodiment, the area of the wafer 1 to be irradiated with the laser beam 21, the intensity of the laser beam 21, also referred to as a laser power density, and the period of time during which the laser beam 21 is applied to the semiconductor device 3-2 in the non-defective semiconductor device bonding step 105 should desirably be of details chosen to melt the adhesive layer 10 without causing damage to the semiconductor device 3-2 and the device 6 as with the removing step 104.

After the non-defective semiconductor device bonding step 105, the sequence goes to a step 106. In addition, if it is determined in the defective/non-defective device determining step 102 that a semiconductor device 3 as a target to be determined is non-defective (defective/non-defective device determining step 102: Yes), the sequence also goes to the step 106.

In the step 106, it is determined whether or not all the semiconductor devices 3 of the wafer 1 have been checked. If it is determined that not all the semiconductor devices 3 of the wafer 1 have been checked (step 106: No), the sequence goes back to the defective/non-defective device determining step 102 to determine whether or not a semiconductor device 3 as a next target to be determined is defective. If it is determined that all the semiconductor devices 3 of the wafer 1 have been checked (step 106: Yes), the manufacturing method according to the first embodiment comes to an end.

In the manufacturing method according to the first embodiment, as described above, it is determined whether or not the semiconductor devices 3 joined to the wafer 1 are defective, one by one. Each semiconductor device 3-1 that has been found defective is removed in the laser beam applying step 103 and the removing step 104, and each non-defective semiconductor device 3-2 is joined to the wafer 1 in the area from which the defective semiconductor device 3-1 has been removed in the non-defective semiconductor device bonding step 105.

In the laser beam applying step 103 of the manufacturing method according to the first embodiment, the adhesive layer 10 by which a defective semiconductor device 3-1 has been joined to the corresponding device 6 is melted to reduce its bonding strength, and the defective semiconductor device 3-1 is removed by dropping freely from the melted adhesive layer 10 in the removing step 104.

Consequently, the manufacturing method according to the first embodiment is capable of manufacturing a wafer 1 that is free of defective semiconductor devices 3-1. As a result, the manufacturing method according to the first embodiment is advantageous in that it prevents the yield of stacked device chips 11 is prevented from being lowered.

In the non-defective semiconductor device bonding step 105 of the manufacturing method according to the first embodiment, a non-defective semiconductor device 3-2 is joined to the area of the wafer 1 from which a defective semiconductor device 3-1 has been removed. Therefore, the manufacturing method according to the first embodiment is advantageous in that it prevents the yield of materials of stacked device chips 11 is prevented from being lowered, resulting in an increase in productivity.

[First Modification of the Laser Beam Applying Step]

Figure 10:
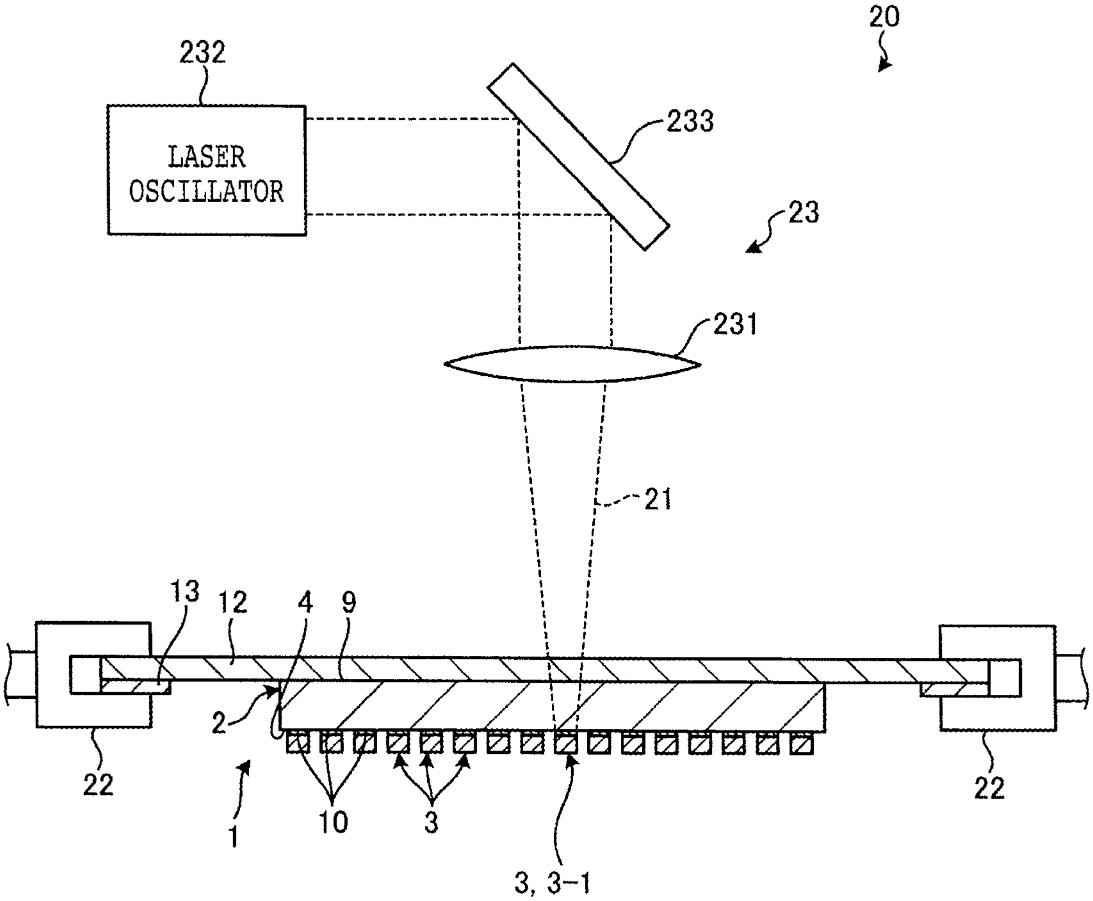
FIG. 10 is a side elevational view, partly in cross section, schematically illustrating a first modification of the laser beam applying step of the method of manufacturing a wafer according to the first embodiment illustrated in FIG. 6.

A first modification of the laser beam applying step of the manufacturing method according to the first embodiment will be described below. FIG. 10 schematically illustrates, in side elevation, partly in cross section, the first modification of the laser beam applying step of the manufacturing method according to the first embodiment. In FIG. 10, those parts that are identical to those according to the first embodiment are denoted by identical reference signs, and will be omitted from detailed description.

The first modification of the laser beam applying step 103 is similar to the first embodiment except that the laser beam 21 is applied to the semiconductor devices 3 through the tape 12 and the substrate wafer 2. According to the first modification of the laser beam applying step 103, the laser processing apparatus 20 grips the outer edge portions of the annular frame 13 and the tape 12 with the grippers 22 such that the face side 4 of the wafer 1 faces downwardly, as illustrated in FIG. 10.

In the first modification of the laser beam applying step 103, the laser processing apparatus 20 orients the focusing lens 231 of the laser beam applying unit 23 that is positioned above the wafer 1 with the annular frame 13 gripped by the grippers 22, in facing relation to the semiconductor device 3-1 that has been determined as defective in the defective/non-defective device determining step 102 along the optical axis of the laser beam 21 applied by the laser beam applying unit 23.

According to the first modification of the laser beam applying step 103, the laser processing apparatus 20 emits the laser beam 21 from the laser oscillator 232 of the laser beam applying unit 23. The laser beam 21 emitted from the laser oscillator 232 is reflected by the mirror 233 toward the focusing lens 231, focuses the laser beam 21 onto the semiconductor device 3-1, and is continuously applied to the semiconductor device 3-1 for a predetermined period of time through the tape 12 and the substrate wafer 2. As with the first embodiment, when irradiated with the laser beam 21, the semiconductor device 3-1 that has been determined as defective in the defective/non-defective device determining step 102 is heated, melting the adhesive layer 10 by which the semiconductor device 3-1 determined as defective in the defective/non-defective device determining step 102 has been fixed to the corresponding device 6, with the result that the bonding strength of the adhesive layer 10 is lowered.

Figure 11:
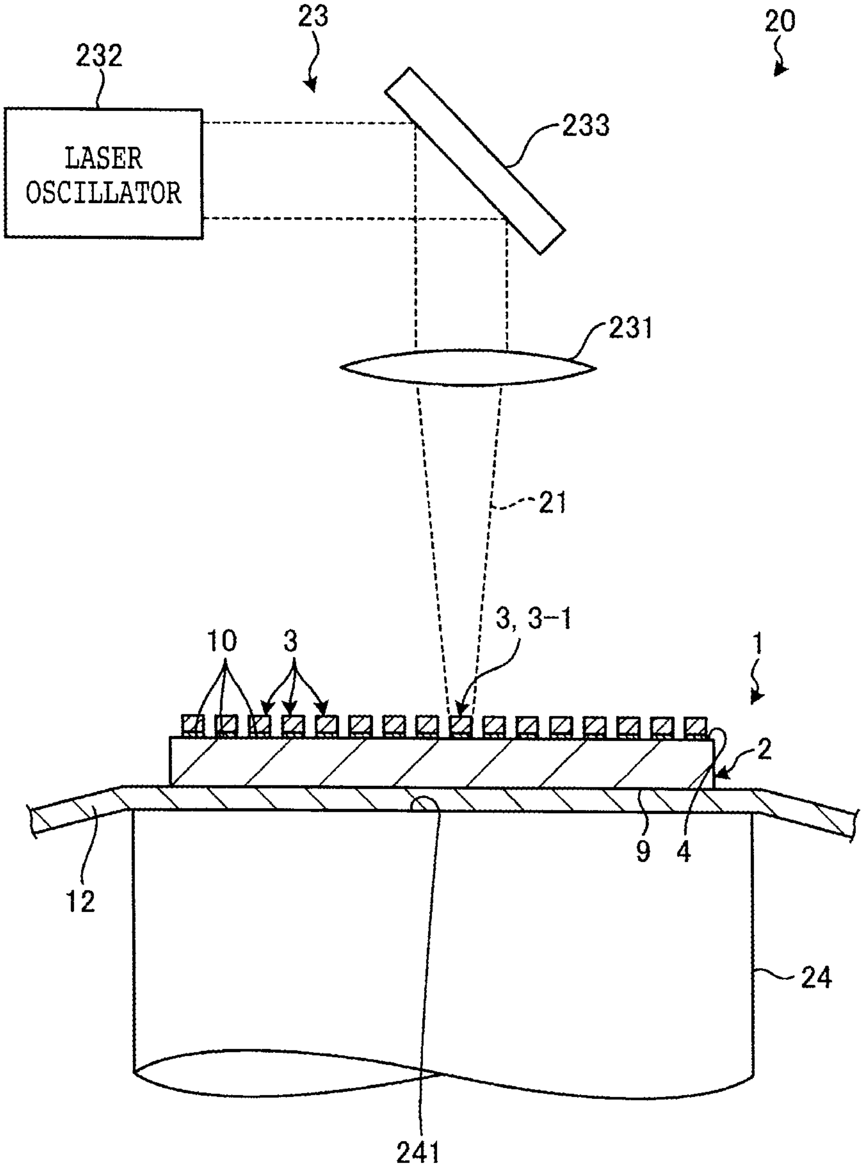
FIG. 11 is a side elevational view, partly in cross section, schematically illustrating a second modification of the laser beam applying step of the method of manufacturing a wafer according to the first embodiment illustrated in FIG. 6.

[Second modification of the laser beam applying step] A second modification of the laser beam applying step of the manufacturing method according to the first embodiment will be described below. FIG. 11 schematically illustrates, in side elevation, partly in cross section, the second modification of the laser beam applying step of the manufacturing method according to the first embodiment. In FIG. 11, those parts that are identical to those according to the first embodiment are denoted by identical reference signs, and will be omitted from detailed description.

The second modification of the laser beam applying step 103 is similar to the first embodiment except that the reverse side 9 of the wafer 1 is held under suction on the holding table 24 with the tape 12 interposed therebetween and the laser beam 21 is applied to the semiconductor devices 3 on the face side 4 of the wafer 1. According to the second modification of the laser beam applying step 103, the laser processing apparatus 20 holds the reverse side 9 of the wafer 1 under suction on the holding surface 241 of the holding table 24 with the tape 12 interposed therebetween, such that the face side 4 of the wafer 1 faces upwardly, as illustrated in FIG. 11.

According to the second modification of the laser beam applying step 103, the laser processing apparatus 20 orients the focusing lens 231 of the laser beam applying unit 23 that is positioned above the wafer 1 held under suction on the holding surface 241 of the holding table 24, in facing relation to the semiconductor device 3-1 that has been determined as defective in the defective/non-defective device determining step 102 along the optical axis of the laser beam 21 applied by the laser beam applying unit 23.

According to the second modification of the laser beam applying step 103, the laser processing apparatus 20 emits the laser beam 21 from the laser oscillator 232 of the laser beam applying unit 23. The laser beam 21 emitted from the laser oscillator 232 is reflected by the mirror 233 toward the focusing lens 231, which focuses the laser beam 21 onto the semiconductor device 3-1. The focused laser beam 21 is continuously applied to the semiconductor device 3-1 for a predetermined period of time. As with the first embodiment, when irradiated with the laser beam 21, the semiconductor device 3-1 that has been determined as defective in the defective/non-defective device determining step 102 is heated, melting the adhesive layer 10 by which the semiconductor device 3-1 determined as defective in the defective/non-defective device determining step 102 has been fixed to the corresponding device 6, with the result that the bonding strength of the adhesive layer 10 is lowered.

[Third Modification of the Laser Beam Applying Step]

Figure 12:
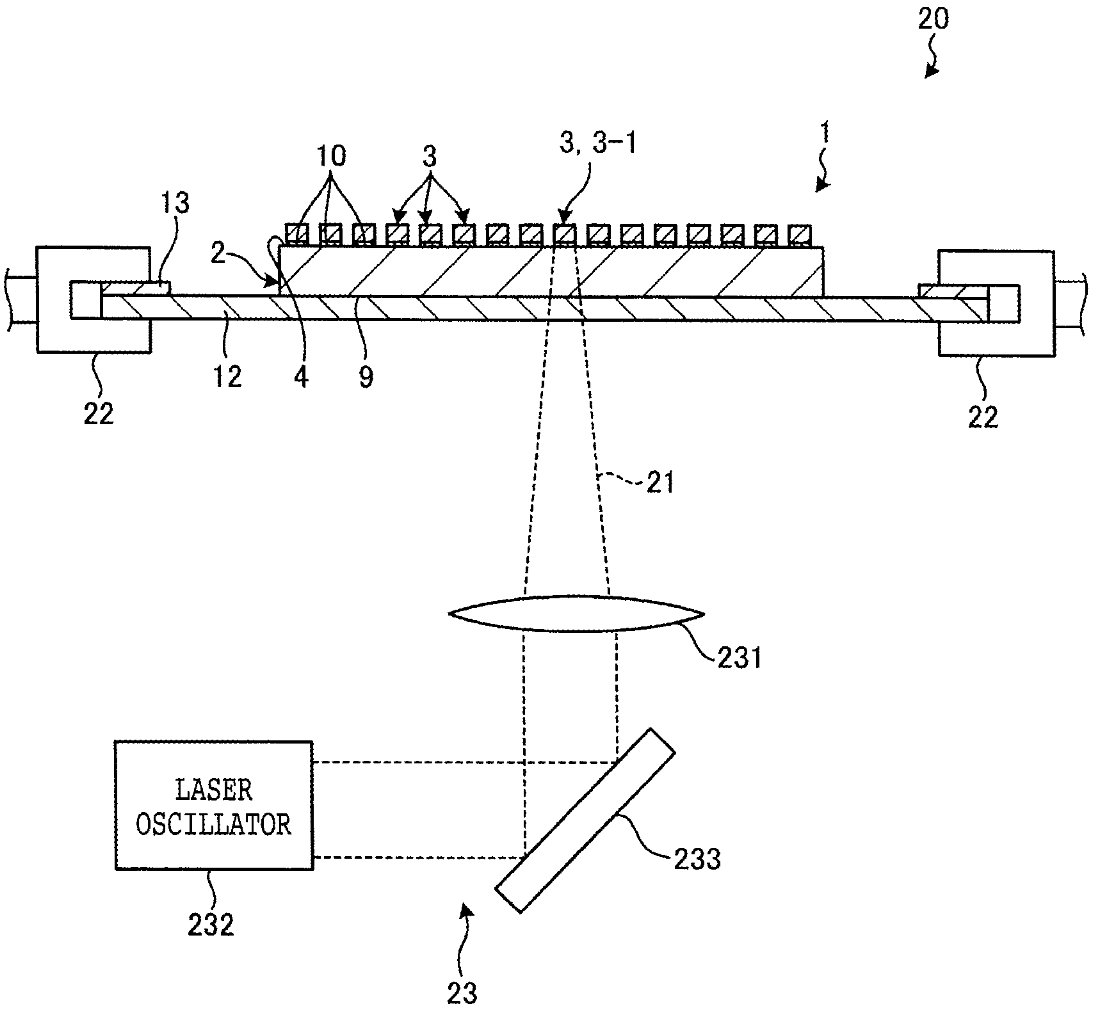
FIG. 12 is a side elevational view, partly in cross section, schematically illustrating a third modification of the laser beam applying step of the method of manufacturing a wafer according to the first embodiment illustrated in FIG. 6.

A third modification of the laser beam applying step of the manufacturing method according to the first embodiment will be described below. FIG. 12 schematically illustrates, in side elevation, partly in cross section, the third modification of the laser beam applying step of the manufacturing method according to the first embodiment. In FIG. 12, those parts that are identical to those according to the first embodiment are denoted by identical reference signs, and will be omitted from detailed description.

The third modification of the laser beam applying step 103 is similar to the first embodiment except that the grippers 22 grip the outer edge portions of the annular frame 13 and the tape 12 such that the face side 4 of the wafer 1 faces upwardly and the laser beam 21 is applied to the semiconductor devices 3 through the tape 12 and the substrate wafer 2. In the third modification of the laser beam applying step 103, the laser processing apparatus 20 grips the outer edge portions of the annular frame 13 and the tape 12 with grippers 22 such that the face side 4 of the wafer 1 faces upwardly, as illustrated in FIG. 12.

In the third modification of the laser beam applying step 103, the laser processing apparatus 20 orients the focusing lens 231 of the laser beam applying unit 23 that is positioned below the wafer 1 with the annular frame 13 gripped by the grippers 22, in facing relation to the semiconductor device 3-1 that has been determined as defective in the defective/non-defective device determining step 102 along the optical axis of the laser beam 21 applied by the laser beam applying unit 23.

In the third modification of the laser beam applying step 103, the laser processing apparatus 20 emits the laser beam 21 from the laser oscillator 232 of the laser beam applying unit 23. The laser beam 21 emitted from the laser oscillator 232 is reflected by the mirror 233 toward the focusing lens 231, which focuses the laser beam 21 onto the semiconductor device 3-1 through the tape 12 and the substrate wafer 2. The focused laser beam 21 is continuously applied to the semiconductor device 3-1 for a predetermined period of time. As with the first embodiment, when irradiated with the laser beam 21, the semiconductor device 3-1 that has been determined as defective in the defective/non-defective device determining step 102 is heated, melting the adhesive layer 10 by which the semiconductor device 3-1 determined as defective in the defective/non-defective device determining step 102 has been fixed to the corresponding device 6, with the result that the bonding strength of the adhesive layer 10 is lowered.

The first, second, and third modifications of the laser beam applying step 103 are advantageous in that they prevent the yield of stacked device chips 11 from being lowered as with the first embodiment because the adhesive layer 10 by which the defective semiconductor device 3-1 has been joined is melted to lower its bonding strength and the defective semiconductor device 3-1 is removed in the removing step 104.

According to the first, second, and third modifications of the laser beam applying step 103, the area of the wafer 1 to be irradiated with the laser beam 21, the intensity of the laser beam 21, also referred to as a laser power density, and the period of time during which the laser beam 21 is applied should desirably be of details chosen to melt the adhesive layer 10 without causing damage to the semiconductor device 3-1 and the device 6, as with the first embodiment etc.

[First Modification of the Removing Step]

Figure 13:
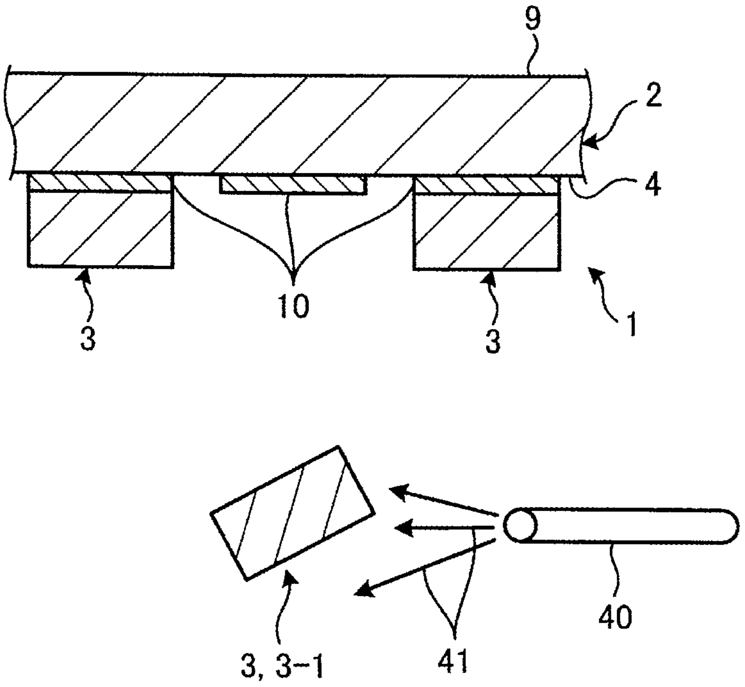
FIG. 13 is an enlarged fragmentary cross-sectional view schematically illustrating a first modification of the removing step of the method of manufacturing a wafer according to the first embodiment illustrated in FIG. 7.

A first modification of the removing step of the manufacturing method according to the first embodiment will be described below. FIG. 13 schematically illustrates, in enlarged fragmentary cross section, the first modification of the removing step of the manufacturing method according to the first embodiment illustrated in FIG. 7. In FIG. 13, those parts that are identical to those according to the first embodiment are denoted by identical reference signs, and will be omitted from detailed description.

The first modification of the removing step 104 is carried out after the laser beam applying step 103 according to the first embodiment illustrated in FIG. 6 and the first modification of the laser beam applying step 103 illustrated in FIG. 10. The first modification of the removing step 104 refers to a step of ejecting a gas 41 toward the semiconductor device 3-1 that has dropped freely off the melted adhesive layer 10, to retrieve the semiconductor device 3-1 in a retrieval box or the like, not illustrated.

According to the first modification of the removing step 104, a nozzle 40 ejects the gas 41 toward the semiconductor device 3-1 that has dropped freely from the wafer 1 under its own weight, as illustrated in FIG. 13 because the bonding strength of the melted adhesive layer 10 has been lowered in the laser beam applying step 103, to blow the semiconductor device 3-1 to the retrieval box, not illustrated, where the semiconductor device 3-1 is retrieved.

[Second Modification of the Removing Step]

Figure 14:
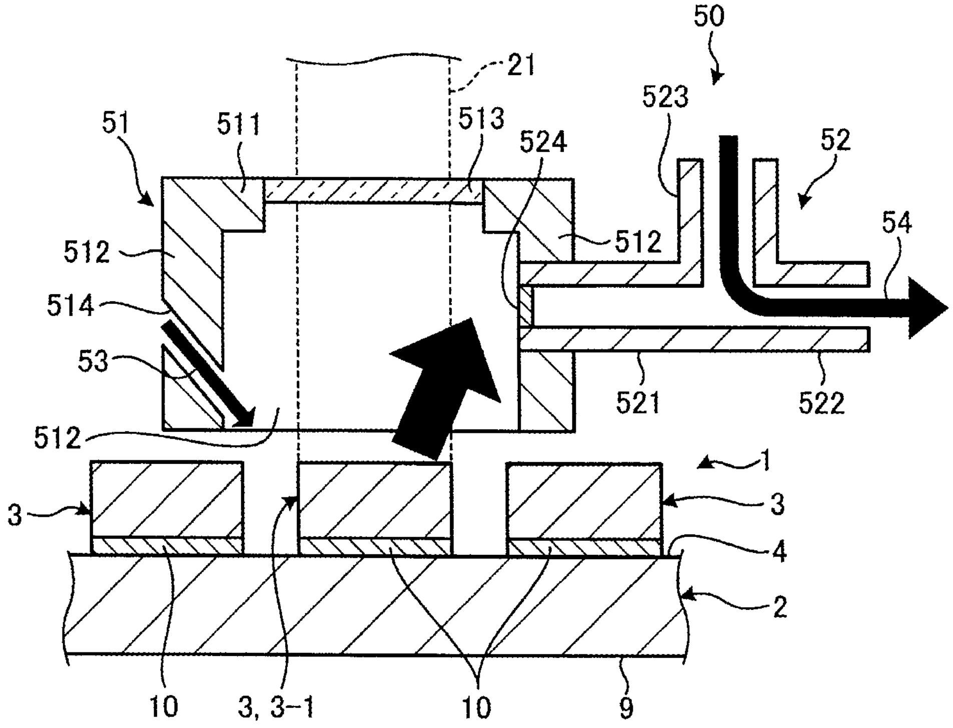
FIG. 14 is an enlarged fragmentary cross-sectional view schematically illustrating a second modification of the removing step of the method of manufacturing a wafer according to the first embodiment illustrated in FIG. 7.
Figure 15:
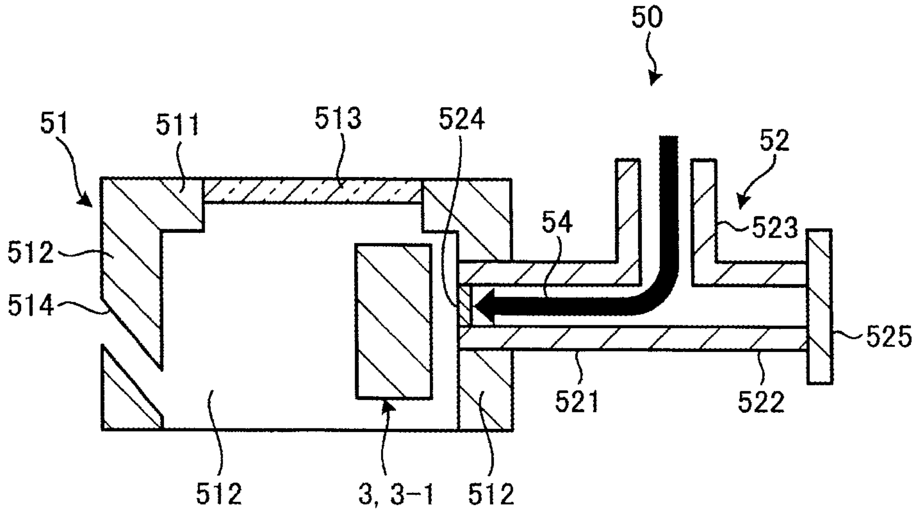
FIG. 15 is an enlarged cross-sectional view schematically illustrating the manner in which a semiconductor device has been removed in the removing step illustrated in FIG. 14.

A second modification of the removing step of the manufacturing method according to the first embodiment will be described below. FIG. 14 schematically illustrates, in enlarged fragmentary cross section, the second modification of the removing step of the manufacturing method according to the first embodiment illustrated in FIG. 7. FIG. 15 schematically illustrates, in enlarged cross section, the manner in which a semiconductor device has been removed in the removing step illustrated in FIG. 14. In FIGS. 14 and 15, those parts that are identical to those according to the first embodiment are denoted by identical reference signs, and will be omitted from detailed description.

The second modification of the removing step 104 is carried out after the second modification of the laser beam applying step 103 illustrated in FIG. 11 and the third modification of the laser beam applying step 103 illustrated in FIG. 12. Specifically, the second modification of the removing step 104 is carried out using a removing unit 50 illustrated in FIG. 14, during and after the laser beam applying step 103.

The removing unit 50 removes the semiconductor device 3 from the wafer 1 whose face side 4 faces upwardly. The removing unit 50 includes a receptacle 51 and a suction blower mechanism 52 connected to the receptacle 51. The receptacle 51 is a box-shaped receptacle having a lower opening and including an upper wall 511 and a plurality of side walls 512 extending downwardly from respective outer edges of the upper wall 511. The upper wall 511 of the receptacle 51 has a planar shape as large as a plurality of semiconductor devices 3 combined together. According to the present invention, the planar shape of the upper wall 511 may be circular, quadrangular, or otherwise. According to the present invention, further, the planar shape of the upper wall 511 may be large enough to introduce at least one semiconductor device 3 into the receptacle 51 through its lower opening.

The upper wall 511 of the receptacle 51 has a glass window 513 made of glass or the like that is transmissive of the laser beam 21. The receptacle 51 is disposed such that the lower opening thereof that leads to a space between the side walls 512 is positioned closely to the semiconductor device 3-1 on the corresponding adhesive layer 10. The glass window 513 allows the laser beam 21 to be applied through the receptacle 51 to the semiconductor device 3-1 disposed beneath the receptacle 51.

One of the side walls 512 has a pressurized-gas supply hole 514 defined therein that is fluidly connected to a pressurized-gas supply source, not illustrated, and that applies a pressurized gas 53, which corresponds to a gas, to the semiconductor device 3-1 that is irradiated with the laser beam 21 applied through the glass window 513. When the pressurized gas 53 is ejected from the pressurized-gas supply hole 514 to the semiconductor device 3-1, it lifts the semiconductor device 3-1 off the adhesive layer 10 whose bonding strength has been lowered by the application of the laser beam 21.

The suction blower mechanism 52 evacuates, i.e., draws air from, the receptacle 51 and introduces a pressurized gas 54 (see FIG. 15) into the receptacle 51. According to the second modification of the removing step 104, the suction blower mechanism 52 is, for example, an ejector including a supply port 521 connected to one of the side walls 512 that faces the side wall 512 with the pressurized-gas supply hole 514 defined therein, a discharge port 522 coupled in line to the supply port 521, and a vacuum port 523 that is connected between the supply port 521 and the discharge port 522 and that supplies the pressurized gas 54 from the pressurized-gas supply source, not illustrated, to the discharge port 522. The suction blower mechanism 52 directs the pressurized gas 54 supplied from the pressurized-gas supply source to the vacuum port 523 toward the discharge port 522, thereby evacuating the supply port 521.

According to the second modification of the removing step 104, the suction blower mechanism 52 includes a filter 524 disposed in the supply port 521 that blocks foreign matter against entry into the receptacle 51 and that allows the pressurized gas 54 to flow into the receptacle 51, and opening/closing means 525 (see FIG. 15) for selectively opening and closing the discharge port 522. Further, the supply port 521 and the discharge port 522 have respective fluid passages defined therein that are dimensioned to prevent the semiconductor devices 3 from passing therethrough.

According to the second modification of the removing step 104, as illustrated in FIG. 14, the receptacle 51 of the removing unit 50 is disposed such that the lower opening thereof is positioned closely to the semiconductor device 3-1 on the corresponding adhesive layer 10, as described above. The pressurized gas 53 is ejected from the pressurized-gas supply hole 514 toward the semiconductor device 3-1, and the suction blower mechanism 52 evacuates the supply port 521 by opening the opening/closing means 525 to send the pressurized gas 54 from the pressurized-gas supply source into the discharge port 522. At the same time, the laser beam 21 is applied through the glass window 513 to the semiconductor device 3-1, as with the first embodiment.

According to the second modification of the removing step 104, as the pressurized gas 53 is ejected toward the semiconductor device 3-1 released from the bonded state, the semiconductor device 3-1 is lifted from the adhesive layer 10 on the face side 4 of the substrate wafer 2 and held under suction on the inner surface of the side wall 512 to which the supply port 521 is connected by the negative pressure developed in the supply port 521. In this manner, the semiconductor device 3-1 is removed from the wafer 1. According to the second modification of the removing step 104, the phrase "released from the bonded state" represents a condition in which the bonding strength of the adhesive layer 10 becomes smaller than the sum of the force applied to lift the semiconductor device 3-1 by the pressurized gas 53 supplied from the pressurized-gas supply hole 514 and the force with which the suction blower mechanism 52 attracts the semiconductor device 3-1 under suction to the inner surface of the side wall 512 to which the supply port 521 is connected.

According to the second modification of the removing step 104, after the laser beam 21 has been applied for the predetermined period of time in the laser bream applying step 103, the receptacle 51 that is holding the semiconductor device 3-1 under suction on the inner surface of the side wall 512 to which the supply port 521 is connected is positioned above the retrieval box, not illustrated. Thereafter, as illustrated in FIG. 15, the discharge port 522 is closed by the opening/closing means 525 to direct the pressurized gas 54 supplied from the vacuum port 523 through the supply port 521 into the receptacle 51. The semiconductor device 3-1 in the receptacle 51 is now pushed off the inner surface of the side wall 512 and retrieved in the retrieval box.

According to the second modification of the removing step 104, the removing unit 50 may be free of the filter 524, and the respective fluid passages defined in the supply port 521 and the discharge port 522 may be dimensioned to allow the semiconductor devices 3-1 to pass therethrough. With the respective fluid passages thus dimensioned, the supply port 521 and the discharge port 522 may discharge the semiconductor device 3-1 therethrough.

According to the first and second modifications of the removing step 104, the adhesive layer 10 by which a defective semiconductor device 3-1 has been joined to the corresponding device 6 is melted to reduce its bonding strength, and the semiconductor device 3-1 is then removed in the removing step 104. Therefore, the first and second modifications of the removing step 104 are advantageous in that they prevent the yield of stacked device chips 11 from being lowered as with the first embodiment.

Figure 16:
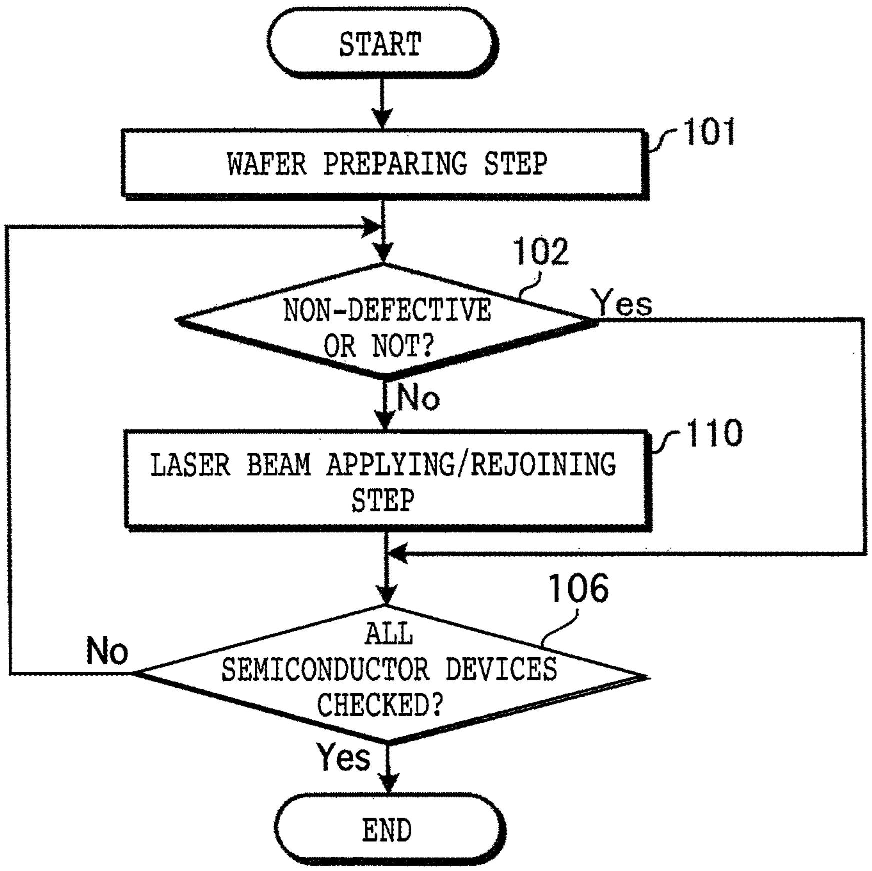
FIG. 16 is a flowchart of a sequence of a method of manufacturing a wafer according to a second embodiment of the present invention.
Figure 17:
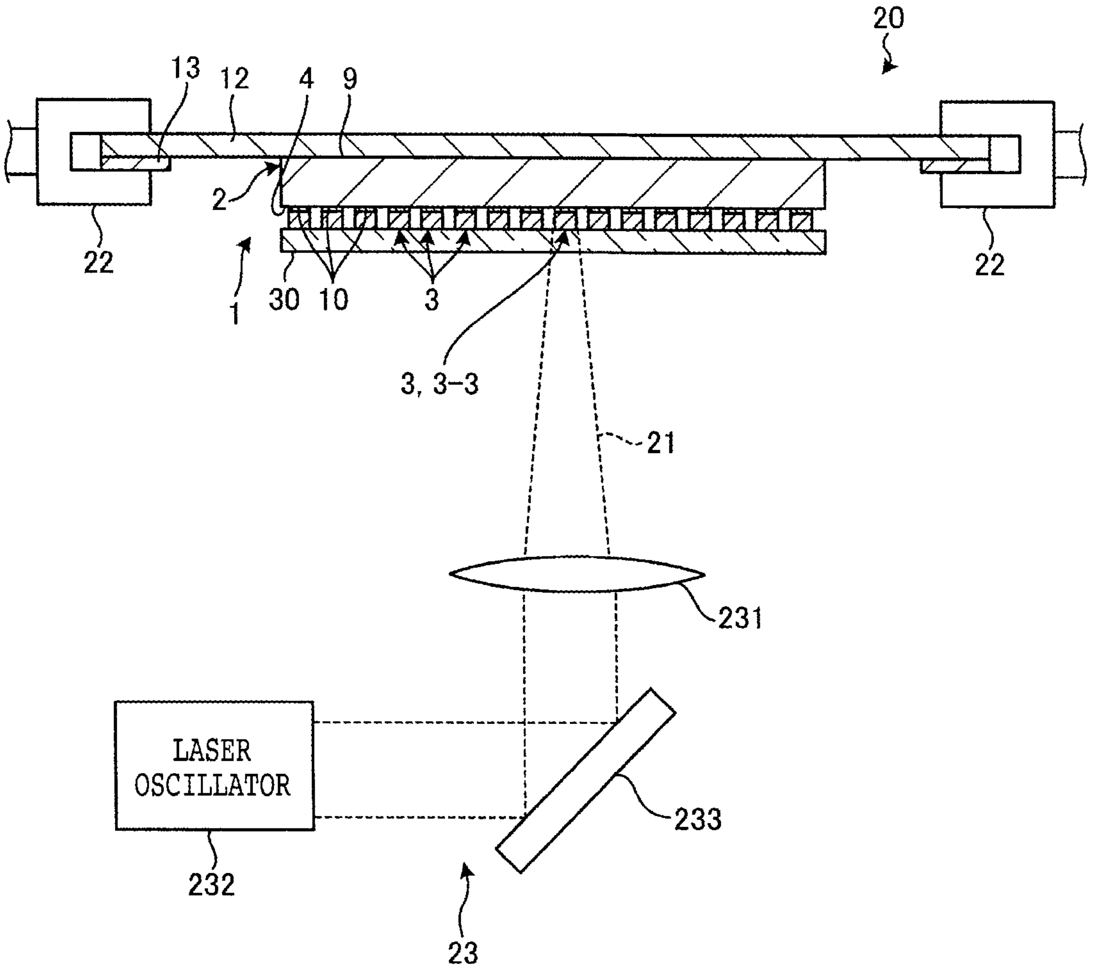
FIG. 17 is a side elevational view, partly in cross section, schematically illustrating a laser beam applying/rejoining step of the method of manufacturing a wafer illustrated in FIG. 16.

[Second embodiment] A method of manufacturing a wafer according to a second embodiment will be described below with reference to the drawings. FIG. 16 is a flowchart of a sequence of the method of manufacturing a wafer according to the second embodiment. FIG. 17 schematically illustrates, in side elevation, partly in cross section, a laser beam applying/rejoining step of the manufacturing method illustrated in FIG. 16. In FIGS. 16 and 17, those parts that are identical to those according to the first embodiment are denoted by identical reference signs, and will be omitted from detailed description.

As illustrated in FIG. 16, the manufacturing method according to the second embodiment is similar to the manufacturing method according to the first embodiment except that the defective/non-defective device determining step 102 is different and a laser beam applying/rejoining step 110 is added in place of the laser beam applying step 103, the removing step 104, and the non-defective semiconductor device bonding step 105.

According to the second embodiment, it is determined in the defective/non-defective device determining step 102 whether or not the joined state of the semiconductor devices 3 joined to the substrate wafer 2 is acceptable, i.e., acceptable or unacceptable. Specifically, it is determined in the defective/non-defective device determining step 102 whether or not the joined state of the semiconductor devices 3 joined to the substrate wafer 2 is acceptable, by determining whether or not the value of electric resistance between predetermined electrodes 8 around each of the semiconductor devices 3 falls in a desired range.

The desired range refers to a range that contains the value of electric resistance between the predetermined electrodes 8 for the acceptable joined state of the semiconductor devices 3 joined to the substrate wafer 2. If it is determined in the defective/non-defective device determining step 102 that the value of electric resistance between predetermined electrodes 8 around a semiconductor device 3 falls in the desired range, the joined state of the semiconductor device 3 joined to the substrate wafer 2 is determined as acceptable. On the other hand, if it is determined in the defective/non-defective device determining step 102 that the value of electric resistance between predetermined electrodes 8 around the semiconductor device 3 falls out of the desired range, the joined state of the semiconductor device 3 joined to the substrate wafer 2 is determined as unacceptable.

If it is determined in the defective/non-defective device determining step 102 that the joined state of a semiconductor device 3 as a target to be determined is not acceptable (defective/non-defective device determining step 102: No), i.e., if the joined state of a semiconductor device 3 as a target to be determined is determined as unacceptable, the sequence of the determining method goes to the laser beam applying/rejoining step 110.

The laser beam applying/rejoining step 110 refers to a step of applying the laser beam 21 from the laser processing apparatus 20 illustrated in FIG. 17 to heat the adhesive layer 10 by which a semiconductor device 3, hereinafter denoted by 3-3, whose joined state has been determined as unacceptable in the defective/non-defective device determining step 102, is joined to the corresponding device 6 on the substrate wafer 2, thereby melting the adhesive layer 10 in the area of the wafer 1 that is irradiated with the laser beam 21. The laser beam applying/rejoining step 110 also refers to a step of rejoining the semiconductor device 3-3 to the device 6 on the substrate wafer 2. Further, the laser beam applying/rejoining step 110 refers to a step of treating the semiconductor device 3-3 released from the bonded state due to the adhesive layer 10 being melted by the applied laser beam. According to the second embodiment, the term "treating" as used above represents rejoining the semiconductor device 3-3.

According to the second embodiment, in the laser beam applying/rejoining step 110, the laser processing apparatus 20 grips the outer edge portions of the annular frame 13 and the tape 12 with the grippers 22 such that the face side 4 of the wafer 1 faces downwardly, and presses the semiconductor device 3-3 toward the substrate wafer 2 with the pressers 30, as illustrated in FIG. 17. Then, the laser processing apparatus 20 orients the focusing lens 231 of the laser beam applying unit 23 that is positioned below the wafer 1 with the annular frame 13 gripped by the grippers 22, in facing relation to the semiconductor device 3-3 that has been determined as defective in the defective/non-defective device determining step 102 along the optical axis of the laser beam 21 applied by the laser beam applying unit 23.

In the laser beam applying/rejoining step 110, the laser processing apparatus 20 emits the laser beam 21 whose wavelength is absorbable by the substrate wafer 2 and the semiconductor devices 3 from the laser oscillator 232 of the laser beam applying unit 23. The laser beam 21 emitted from the laser oscillator 232 is reflected by the mirror 233 toward the focusing lens 231, which focuses the laser beam 21 onto the semiconductor device 3-3 that has been determined as defective in the defective/non-defective device determining step 102. The focused laser beam 21 is continuously applied to the semiconductor device 3-3 for a predetermined period of time.

When irradiated with the laser beam 21, the semiconductor device 3-3 that has been determined as defective in the defective/non-defective device determining step 102 is heated, melting the adhesive layer 10 by which the semiconductor device 3-3 determined as defective in the defective/non-defective device determining step 102 has been fixed to the corresponding device 6. In the laser beam applying/rejoining step 110, since the semiconductor device 3-3 is being pressed toward the substrate wafer 2 by the presser 30, the adhesive layer 10 is held in intimate contact with the semiconductor device 3-3. Then, the laser processing apparatus 20 stops applying the laser beam 21. The temperature of the adhesive layer 10 is lowered, allowing the adhesive layer 10 to solidify to thereby rejoin the semiconductor device 3-3 to the corresponding device 6 on the substrate wafer 2. After the laser beam applying/rejoining step 110, the sequence of the manufacturing method according to the second embodiment goes to the step 106.

The area of the wafer 1 to be irradiated with the laser beam 21, the intensity of the laser beam 21, also referred to as a laser power density, and the period of time during which the laser beam 21 is applied to the semiconductor device 3-3 in the laser beam applying/rejoining step 110 should desirably be of details chosen to melt the adhesive layer 10 without causing damage to the semiconductor device 3-3 and the device 6, as with the laser beam applying step 103 according to the first embodiment etc.

In the manufacturing method according to the second embodiment, in the laser beam applying/rejoining step 110, the adhesive layer 10 by which the defective semiconductor device 3-3 that has been joined to the corresponding device 6 is melted to rejoin the semiconductor device 3-3 to the corresponding device 6 on the substrate wafer 2. As a consequence, the manufacturing method according to the second embodiment is advantageous in that it can manufacture a wafer 1 free of defective semiconductor device 3-3 and prevents the yield of stacked device chips 11 from being lowered.

[First Modification]

Figure 18:
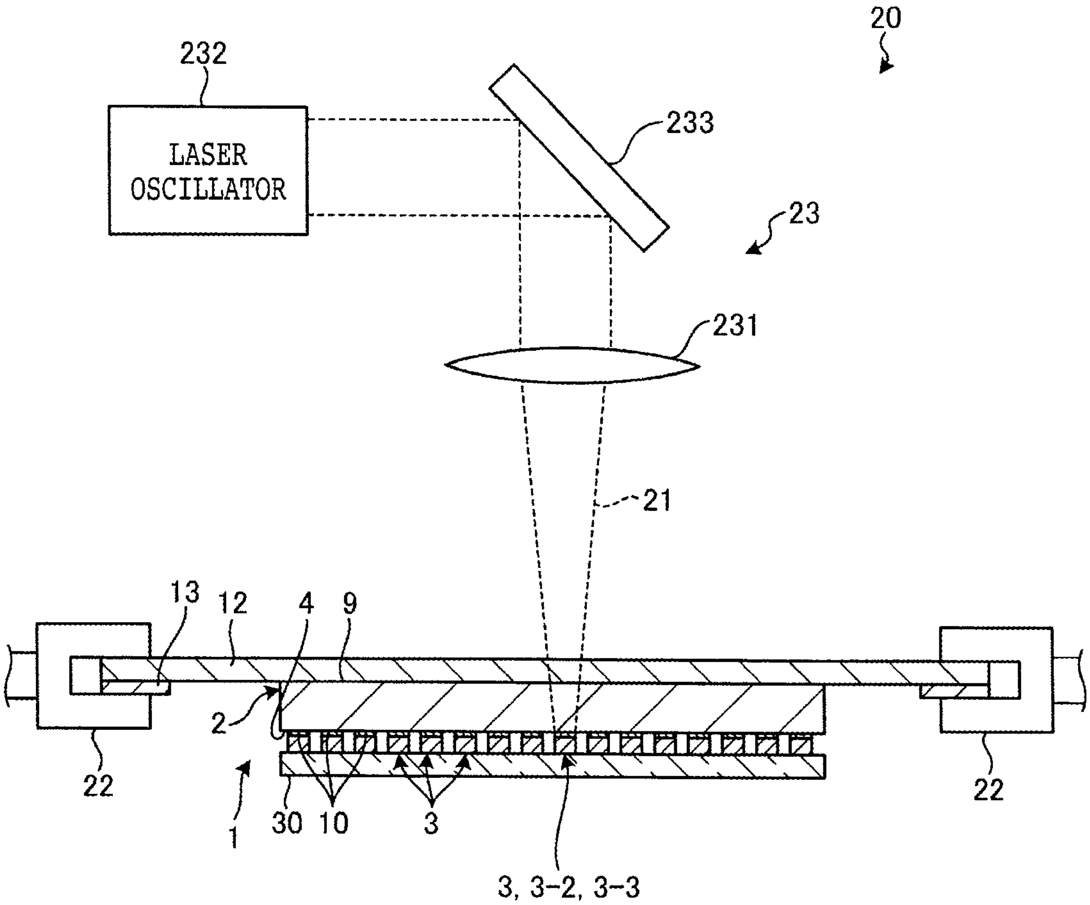
FIG. 18 is a side elevational view, partly in cross section, schematically illustrating a non-defective semiconductor device bonding step and a laser beam applying/rejoining step of a method of manufacturing a wafer according to a first modification of the first and second embodiments.

A method of manufacturing a wafer according to a first modification of the first and second embodiments will be described below with reference to the drawings. FIG. 18 schematically illustrates, in side elevation, partly in cross section, a non-defective semiconductor device bonding step and a laser beam applying/rejoining step of the method of manufacturing a wafer according to the first modification of the first and second embodiments. In FIG. 18, those parts that are identical to those according to the first and second embodiments are denoted by identical reference signs, and will be omitted from detailed description.

The first modification is similar to the first and second embodiments except that the laser beam 21 is applied to the semiconductor device 3-2/3-3 through the tape 12 and the substrate wafer 2. According to the first modification, the laser processing apparatus 20 grips the outer edge portions of the annular frame 13 and the tape 12 with grippers 22 such that the face side 4 of the wafer 1 faces downwardly, as illustrated in FIG. 18.

According to the first modification, the laser processing apparatus 20 orients the focusing lens 231 of the laser beam applying unit 23 that is positioned above the wafer 1 with the annular frame 13 gripped by the grippers 22, in facing relation to the semiconductor device 3-2/3-3 along the optical axis of the laser beam 21 applied by the laser beam applying unit 23. The laser processing apparatus 20 emits the laser beam 21 from the laser oscillator 232 of the laser beam applying unit 23 while pressing the semiconductor devices 3 toward the substrate wafer 2 with the presser 30. The laser beam 21 emitted from the laser oscillator 232 is reflected by the mirror 233 toward the focusing lens 231, which focuses the laser beam 21 onto the semiconductor device 3-2/3-3 through the tape 12 and the substrate wafer 2. The focused laser beam 21 is continuously applied to the semiconductor device 3-2/3-3 for a predetermined period of time, joining the semiconductor device 3-2/3-3 to the corresponding device 6 on the substrate wafer 2, as with the first and second embodiments.

In the manufacturing method according to the first modification, the adhesive layer 10 is melted to join the semiconductor device 3-2/3-3 to the corresponding device 6 on the substrate wafer 2. Therefore, the manufacturing method according to the first modification is advantageous in that it can manufacture a wafer 1 free of defective semiconductor device 3-2/3-3 and prevents the yield of stacked device chips 11 from being lowered.

[Second Modification]

Figure 19:
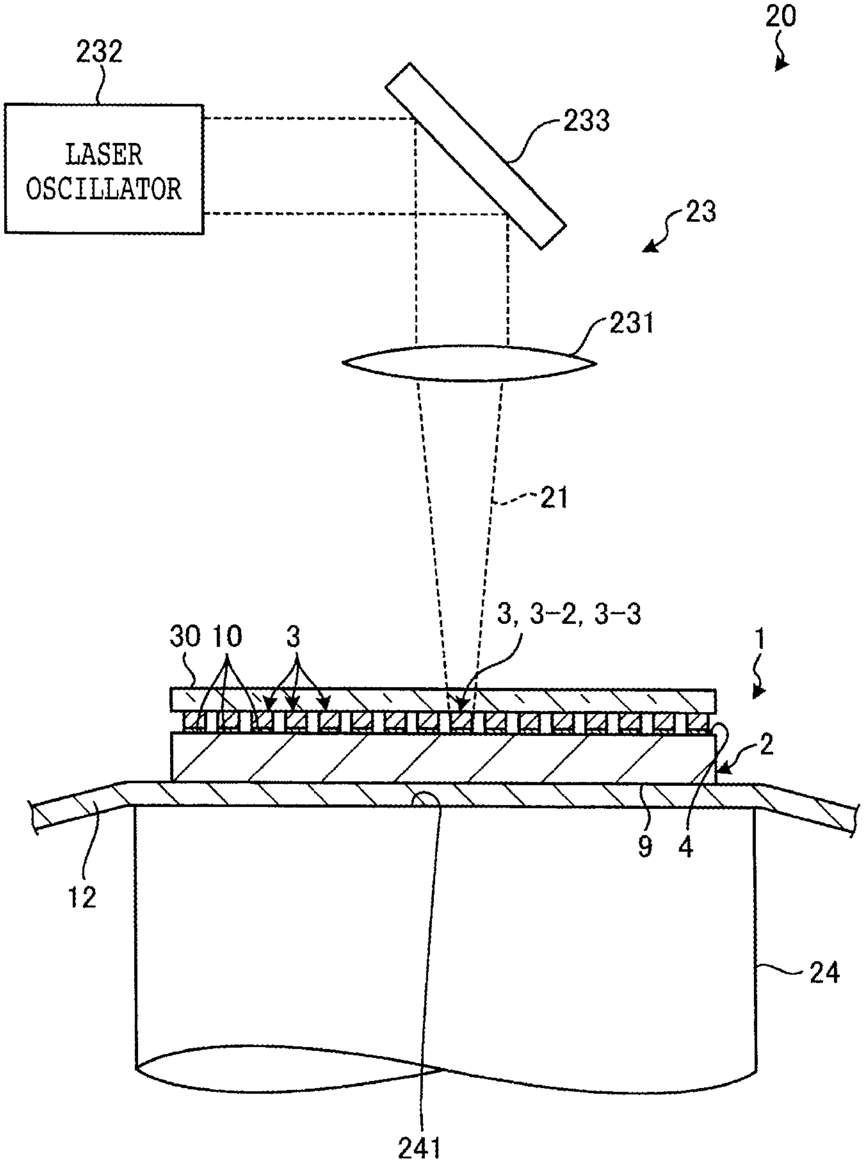
FIG. 19 is a side elevational view, partly in cross section, schematically illustrating a non-defective semiconductor device bonding step and a laser beam applying/rejoining step of a method of manufacturing a wafer according to a second modification of the first and second embodiments.

A method of manufacturing a wafer according to a second modification of the first and second embodiments will be described below with reference to the drawings. FIG. 19 schematically illustrates, in side elevation, partly in cross section, a non-defective semiconductor device bonding step and a laser beam applying/rejoining step of the method of manufacturing a wafer according to the second modification of the first and second embodiments. In FIG. 19, those parts that are identical to those according to the first and second embodiments are denoted by identical reference signs, and will be omitted from detailed description.

The second modification is similar to the first and second embodiments except that the reverse side 9 of the wafer 1 is held under suction on the holding table 24 with the tape 12 interposed therebetween and the laser beam 21 is applied to the semiconductor device 3-2/3-3 on the face side 4 of the wafer 1. According to the second modification, the laser processing apparatus 20 holds the reverse side 9 of the wafer 1 under suction on the holding surface 241 of the holding table 24 with the tape 12 interposed therebetween, such that the face side 4 of the wafer 1 faces upwardly, as illustrated in FIG. 19.

According to the second modification, the laser processing apparatus 20 orients the focusing lens 231 of the laser beam applying unit 23 that is positioned above the wafer 1 held under suction on the holding surface 241 of the holding table 24, in facing relation to the semiconductor device 3-2/3-3 along the optical axis of the laser beam 21 applied by the laser beam applying unit 23. While pressing the semiconductor device 3-2/3-3 toward the substrate wafer 2 with the presser 30, the laser processing apparatus 20 emits the laser beam 21 from the laser oscillator 232 of the laser beam applying unit 23. The laser beam 21 emitted from the laser oscillator 232 is reflected by the mirror 233 toward the focusing lens 231, which focuses the laser beam 21 onto the semiconductor device 3-2/3-3. The focused laser beam 21 is continuously applied to the semiconductor device 3-2/3-3 for a predetermined period of time, joining the semiconductor device 3-2/3-3 to the corresponding device 6 on the substrate wafer 2, as with the first and second embodiments.

In the manufacturing method according to the second modification, the adhesive layer 10 is melted to join the semiconductor device 3-2/3-3 to the corresponding device 6 on the substrate wafer 2. Therefore, the manufacturing method according to the second modification is advantageous in that it can manufacture a wafer 1 free of defective semiconductor wafer 3-2/3-3 and prevents the yield of stacked device chips 11 from being lowered, as with the first embodiment etc.

[Third Modification]

Figure 20:
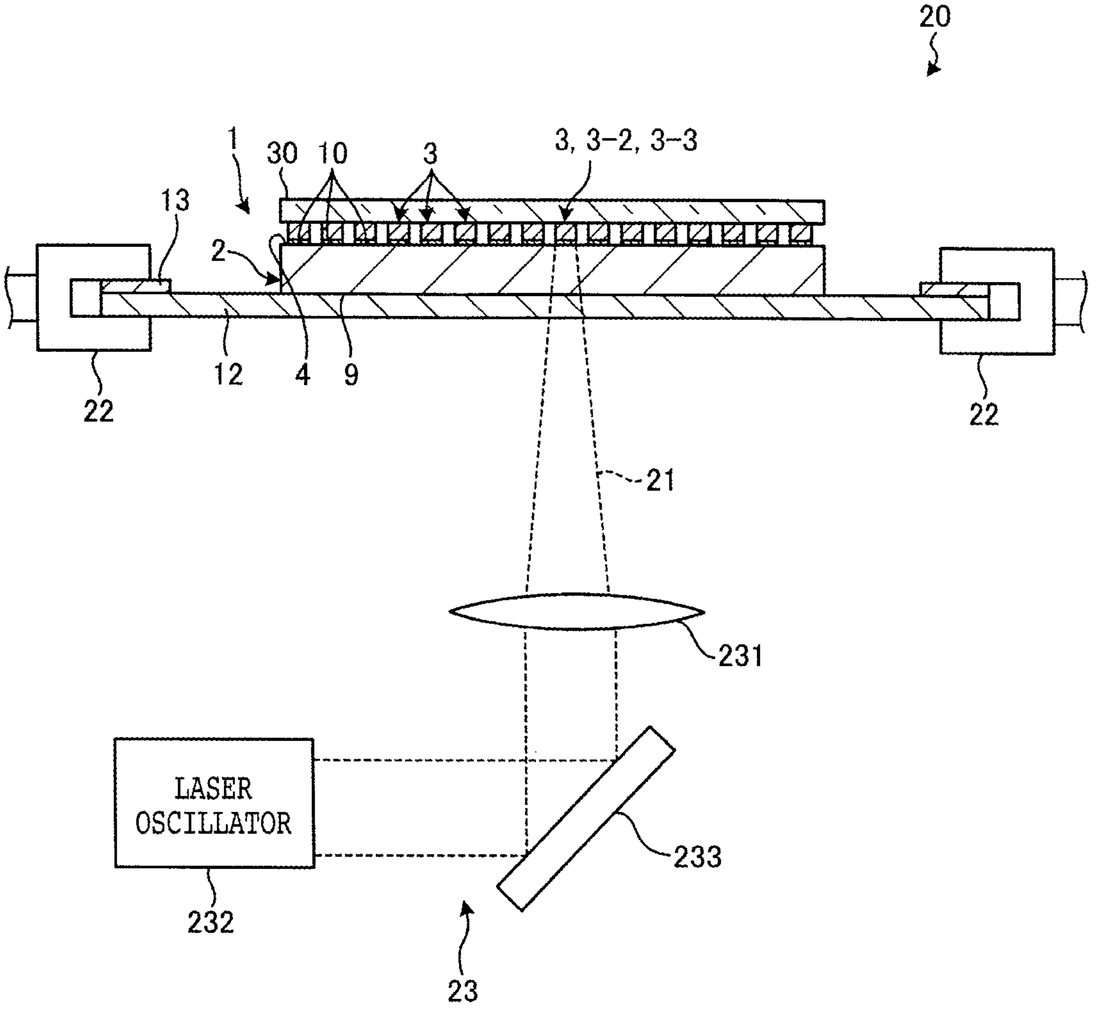
FIG. 20 is a side elevational view, partly in cross section, schematically illustrating a non-defective semiconductor device bonding step and a laser beam applying/rejoining step of a method of manufacturing a wafer according to a third modification of the first and second embodiments.

A method of manufacturing a wafer according to a third modification of the first and second embodiments will be described below with reference to the drawings. FIG. 20 schematically illustrates, in side elevation, partly in cross section, a non-defective semiconductor device bonding step and a laser beam applying/rejoining step of the method of manufacturing a wafer according to the third modification of the first and second embodiments. In FIG. 20, those parts that are identical to those according to the first and second embodiments are denoted by identical reference signs, and will be omitted from detailed description.

The third modification is similar to the first and second embodiments except that the laser processing apparatus 20 grips the outer edge portions of the annular frame 13 and the tape 12 with grippers 22 such that the face side 4 of the wafer 1 faces upwardly and the laser beam 21 is applied to the semiconductor device 3-2/3-3 through the tape 12 and the substrate wafer 2. According to the third modification, the laser processing apparatus 20 grips the outer edge portions of the annular frame 13 and the tape 12 with the grippers 22 such that the face side 4 of the wafer 1 faces upwardly, as illustrated in FIG. 20.

According to the third modification, the laser processing apparatus 20 orients the focusing lens 231 of the laser beam applying unit 23 that is positioned below the wafer 1 with the annular frame 13 gripped by the grippers 22, in facing relation to the semiconductor device 3-2/3-3 along the optical axis of the laser beam 21 applied by the laser beam applying unit 23. While pressing the semiconductor device 3-2/3-3 toward the substrate wafer 2 with the presser 30, the laser processing apparatus 20 emits the laser beam 21 from the laser oscillator 232 of the laser beam applying unit 23. The laser beam 21 emitted from the laser oscillator 232 is reflected by the mirror 233 toward the focusing lens 231, which focuses the laser beam 21 onto the semiconductor device 3-2/3-3. The focused laser beam 21 is continuously applied to the semiconductor device 3-2/3-3 for a predetermined period of time, joining the semiconductor device 3-2/3-3 to the corresponding device 6 on the substrate wafer 2, as with the first and second embodiments.

In the manufacturing method according to the third modification, the adhesive layer 10 is melted to join the semiconductor device 3-2/3-3 to the corresponding device 6 on the substrate wafer 2. Therefore, the manufacturing method according to the third modification is advantageous in that it can manufacture a wafer 1 free of defective semiconductor device 3-2/3-3 and prevents the yield of stacked device chips 11 from being lowered, as with the first embodiment etc.

The present invention is not limited to the above embodiments and modifications. Various changes and modifications may be made therein without departing from the scope of the present invention. According to the present invention, the non-defective semiconductor device bonding step 105 may be dispensed with in the manufacturing method according to the first embodiment. Further, providing the laser processing apparatus 20 includes a spatial optical modulator, the focusing lens 231 may not be used, and the spatial optical modulator may be used to focus the laser beam 21 onto the semiconductor device 3-1/3-2/3-3.

According to the present invention, the presser 30 may not necessarily be used in the non-defective semiconductor device bonding step 105 and the laser beam applying/rejoining step 110. According to the present invention, moreover, the tape 12 affixed to the reverse side 9 of the wafer 1 may not be indispensable.

According to the present invention, in the defective/non-defective device determining step 102 of the manufacturing method according to the second embodiment, instead of measuring the value of electric resistance between predetermined electrodes 8, any of various types of means, e.g., means for capturing an image of semiconductor devices 3 and processing the captured image, may be used to determine whether or not the joined state of the semiconductor devices 3 is acceptable.

In the above embodiments and modifications, the wafer 1 includes a wafer-on-wafer (WOW) assembly in which the semiconductor devices 3 are joined to the devices 6 on the substrate wafer 2 by the adhesive layers 10. According to the present invention, however, the wafer 1 is not limited to a WOW assembly.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a wafer, comprising:

a wafer preparing step of preparing a wafer including a plurality of semiconductor devices joined to a substrate by respective adhesive layers;

a determining step of determining whether each of the semiconductor devices joined to the substrate is defective or non-defective;

a laser beam applying step of applying a laser beam to heat one of the adhesive layers by which one of the semiconductor devices that has been determined as defective is bonded to the substrate, thereby melting the adhesive layer in an area of the wafer that is irradiated with the laser beam; and a treating step of treating the semiconductor device released from a bonded state due to the adhesive layer being melted in the laser beam applying step, wherein the treating step is a removing step of removing the semiconductor device from the substrate, and wherein the removing step includes:

a step of providing a removing unit having a receptacle and a suction blower mechanism attached to the receptacle;

a step of positioning the receptacle over the semiconductor device, the receptacle being sized to receive at least one semiconductor device through a lower opening thereof;

a step of applying the laser beam through the receptacle to release the semiconductor device from the bonded state;

a step of ejecting a gas from the suction blower mechanism toward the semiconductor device released from the bonded state to lift the semiconductor device off the substrate, and a step of attracting the lifted semiconductor device under suction into the receptacle to remove the semiconductor device from the substrate and hold the semiconductor device in the receptacle; and a step of ejecting a gas from the suction blower mechanism toward the semiconductor device to release the semiconductor device from the receptacle.

2. The method of manufacturing a wafer according to claim 1, wherein the laser beam is applied to the adhesive layer through the semiconductor device.

3. The method of manufacturing a wafer according to claim 1, further comprising:

a non-defective semiconductor device bonding step, after the removing step, of bonding a semiconductor device having same functions as those of the semiconductor device determined as defective to an area from which the semiconductor device determined as defective has been removed.

4. The method of manufacturing a wafer according to claim 1, wherein, in the wafer preparing step, the wafer is attached to tape that is attached to a frame.

5. The method of manufacturing a wafer according to claim 4, wherein the wafer is attached to the tape so that a face side of the wafer faces upwardly.

6. The method of manufacturing a wafer according to claim 1, wherein the step of attracting the lifted semiconductor device under suction into the receptacle includes directing a pressurized gas into a gas supply mechanism having a supply port and a discharge port, wherein opening the discharge port allows the pressurized gas to flow out of the discharge port and create suction through the supply port to suction and hold the semiconductor device in the receptacle.

7. The method of manufacturing a wafer according to claim 6, wherein in the step of ejecting a gas from the suction blower mechanism toward the semiconductor device to release the semiconductor device from the receptacle, includes closing the discharge port to direct the pressurized air through the supply port and into the receptacle to release the semiconductor device from the receptacle.

* * * * *